(12) United States Patent
Hershman et al.

(10) Patent No.: US 11,342,044 B2
(45) Date of Patent: *May 24, 2022

(54) SYSTEM AND METHOD FOR PRIORITIZATION OF BIT ERROR CORRECTION ATTEMPTS

(71) Applicant: NUVOTON TECHNOLOGY CORPORATION, Hsinchu Science Park (TW)

(72) Inventors: Ziv Hershman, Givat Shmuel (IL); Ilan Margalit, Tel-Aviv (IL); Avraham Fishman, Ra'anana (IL)

(73) Assignee: NUVOTON TECHNOLOGY CORPORATION, Hsinchu Science Park (TW)

( * ) Notice: Subject to any disclaimer, the term of this patent is extended or adjusted under 35 U.S.C. 154(b) by 204 days.

This patent is subject to a terminal disclaimer.

(21) Appl. No.: 16/588,089

(22) Filed: Sep. 30, 2019

(65) Prior Publication Data
US 2020/0381076 A1 Dec. 3, 2020

Related U.S. Application Data

(63) Continuation-in-part of application No. 16/423,676, filed on May 28, 2019.

(51) Int. Cl.
*G06F 21/00* (2013.01)
*G11C 29/52* (2006.01)
*G11C 29/50* (2006.01)
*G11C 29/44* (2006.01)
*G11C 29/34* (2006.01)
*G11C 29/42* (2006.01)

(52) U.S. Cl.
CPC ............. *G11C 29/52* (2013.01); *G11C 29/34* (2013.01); *G11C 29/42* (2013.01); *G11C 29/44* (2013.01); *G11C 29/50004* (2013.01)

(58) Field of Classification Search
CPC ......... G11C 29/52; G11C 29/34; G11C 29/42; G11C 29/44; G11C 29/50004
See application file for complete search history.

(56) References Cited

U.S. PATENT DOCUMENTS

| | | | |
|---|---|---|---|
| 6,838,331 B2 | 1/2005 | Klein | |
| 7,266,747 B2 | 9/2007 | Foss | |
| 7,626,868 B1 | 12/2009 | Wang | |
| 7,937,639 B2 | 5/2011 | Sonnekalb | |

(Continued)

OTHER PUBLICATIONS

"Data Scrubbing"; Wikipedia; pp. 1-4; Mar. 2019.

(Continued)

*Primary Examiner* — Ghazal B Shehni
(74) *Attorney, Agent, or Firm* — Oliff PLC

(57) ABSTRACT

System, method and computer program product for prioritizing trial-and-error attempted corrections of bit/s, in a memory, in which logical bit levels are determined by thresholding voltage values using threshold/s, the method comprising ranking bits such that a first bit is ranked before a second bit, which is less likely than said first bit to be erroneous and sequentially attempting to correct the bits in order of the ranking, including attempting to correct the first bit before attempting to correct the second bit.

15 Claims, 16 Drawing Sheets

(56) References Cited

U.S. PATENT DOCUMENTS

| | | | |
|---|---|---|---|
| 8,456,919 B1* | 6/2013 | Jeon | G06F 11/1072 365/185.24 |
| 8,817,972 B2 | 8/2014 | Gaborit | |
| 9,525,546 B2 | 12/2016 | Alon | |
| 10,026,488 B2 | 7/2018 | Reusswig et al. | |
| 2002/0087652 A1 | 7/2002 | Davis et al. | |
| 2005/0283566 A1 | 12/2005 | Callaghan | |
| 2006/0256615 A1 | 11/2006 | Larson | |
| 2007/0089034 A1 | 4/2007 | Litsyn et al. | |
| 2008/0123407 A1* | 5/2008 | Park | G11C 11/5642 365/185.03 |
| 2008/0168319 A1 | 7/2008 | Lee et al. | |
| 2008/0222491 A1 | 9/2008 | Lee et al. | |
| 2009/0164704 A1 | 6/2009 | Kanade et al. | |
| 2011/0047604 A1 | 2/2011 | Bolotin et al. | |
| 2013/0235661 A1 | 9/2013 | Wang | |
| 2014/0082721 A1 | 3/2014 | Hershman et al. | |
| 2015/0193302 A1* | 7/2015 | Hyun | G06F 11/108 714/764 |
| 2015/0255164 A1 | 9/2015 | Grant | |
| 2015/0341350 A1 | 11/2015 | Mandal et al. | |
| 2016/0050067 A1 | 2/2016 | Merchan et al. | |
| 2017/0255512 A1 | 9/2017 | Zamir et al. | |
| 2018/0062668 A1 | 3/2018 | Moon et al. | |
| 2018/0091308 A1* | 3/2018 | Durham | G06F 12/1408 |
| 2018/0239665 A1 | 8/2018 | Hutton et al. | |
| 2018/0246783 A1 | 8/2018 | Avraham et al. | |

OTHER PUBLICATIONS

"Secure Hash Algorithms"; Wikipedia; pp. 1-2; Mar. 2018.

"Get NVM Thresholds (Function Index 5)," Oct. 17, 2018, [https://docs.microsoft.com/en-us/windows-hardware/drivers/storage/get-nvm-thresholds-function-index-5].

Burnett et al., "Natural VT (VT0) distribution of a typical 512k-bit array from two different NVM technologies," Feb. 2002, [https://www.researchgate.net/figure/Natural-VT-VTO-distribution-of-a-typical-512k-bit-array-from-two-different-NVM_fig1_3997562].

"What is 'Margin Read'?," RFID Journal, Jul. 16, 2019, [https://www.rfidjournal.com/blogs/experts/entry?12162].

Keating et al., "Programming and Erasing Flash Memory on the MC68HC908AS60," Freescale Semiconductor, 2004, pp. 1-60.

"8-bit MCU Knowledge Base," Silicon Labs, Mar. 31, 2016, [https://www.silabs.com/community/mcu/8-bit/knowledge-base.entry.html/2016/03/ 31/c8051t616_marginrea-wjZg ].

Crosby, Bob, "Using Read Margin Modes in TMS470 F05 Flash Microcontrollers," Texas Instruments, Feb. 2006 pp. 1-11.

Geethumol et al., "Read Stability Analysis of 6T SRAM Bit Cell," International Journal of Recent Trends in Engineering & Research, May 2016, vol. 2, No. 5, pp. 155-165.

U.S. Appl. No. 16/423,676, filed May 28, 2019 in the name of Ziv Hershman et al.

\* cited by examiner

FIG. 2

Operation 10: Provide an integrated circuit in which memory content e.g. code stored in memory, is protected by both Power-up 'strong auth' and On-the-fly 'word auth'

Operation 20: each time on-the-fly word auth fails (e.g. during runtime), the integrated circuit halts or is automatically restarted.

Operation 30: On next power-up (e.g.) all 'word auth' are checked as part of the 'strong auth' computation already being used to protect the memory content. If a 'word auth' fails during power-up auth the integrated circuit attempts to correct the error that has been found in its memory content e.g. by performing operation/s 140 – 170 of Fig. 3.

Operation 80: if the memory is a code execution memory, a suitable Power-fail safe Code recovery update flow may be executed if error correction e.g. performing operation/s 140 – 170 of Fig. 3 results in resolving of corrected code. Once the code has been successfully corrected, the processor can resume running aka normal operation.

FIG. 3

Operation 140: All one bit permutations of the bad word are checked, searching for a match.

Operation 150: If a match is found, the erroneous data or content as corrected or rectified may be digested as part of the 'strong auth' computation.

Operation 160: otherwise, optionally, try to correct more than one error e.g. by searching again, this time over at least some double-bit permutations of the error. It is appreciated that if more than one error (involving more than one bit) can be corrected with high likelihood, but according to some embodiments errors involving plural bits are not corrected because computation is more complicated than for one bit, requiring $\sim X^2/2$ ($\sim 144^2/2$) checks.

Operation 170: If error cannot be corrected, typically an alert is provided to the end-user e.g. via higher level software as shown in Fig. 1.

FIG. 4

Operation 210: Identify the flash pages to be corrected. If there is more than one page, for each, keep (an indication of) the words (addresses + data) that needs to be corrected in volatile memory, then perform operation 220 or operation 230.

Operation 220: correct each page that needs to be corrected, e.g. by performing, for each page, all of operations 310 – 350 in Fig. 5. End.

Operation 230: During boot time, before flash code authentication is performed, the boot code checks if there is a page which is known to be e.g. marked as usable, and if so, the boot code completes all of operations 310 - 350 before continuing the boot. Otherwise, some higher level firmware may perform 'garbage collection'.

FIG. 5

Operation 310: Write the flash page address and corrected data (code) in a reserved predefined flash page and verifies that it was written correctly.

↓

Operation 320: Set a bit in the reserved page that indicates e.g. to other firmware that this page carries valid info, or is in use and should not be erased.

↓

Operation 330: Erase original flash page (that in which error/s was/were found in operation 210 of Fig. 4)

↓

Operation 340: Update original flash page with corrected data from the reserved flash page and verify that it was written correctly

↓

Operation 350: Erase the reserved page to enable future use thereof for correction of errors in other pages

FIG. 6

Operation 1001 – Fill the memory zone with contents, e.g. code, which includes a multiplicity of words. For each word, compute the "word auth" while writing, and store the "word auth"

Operation 1002 – Run "strong auth" over the memory contents and store result

Operation 1003 – Use the memory as usual including performing memory reads. Each memory read includes: computation of a current aka recomputed "word auth", reading from memory, the pre-computed word-auth stored in Operation 1001, and comparing the two. If recomputed "word auth" equals the pre-computed word-auth read from memory, else enter error correction sequence.

FIG. 7

Operation 1006 – perform error correction on content to be corrected including the word and its associated word auth, combined.

Operation 1008 – flag uncorrectable memory contents, and/or halt system, and/or processor 1 may prompt for higher level recovery

Operation 1009 – Do "strong auth" including computing a digest e.g. HMAC for the whole memory zone, thereby to yield a strong-auth result. Typically, strong auth yields a digest/MAC/signature.

Operation 10010 – Compare the strong auth result to the pre-computed pre-computed strong-auth result stored in memory in Operation 1002. If the results are equal, there is a strong-auth match; otherwise (unequal) there is a strong-auth mismatch.

Operation 10011 – If there is a strong auth match – memory contents is qualified after correction, continue using memory as usual e.g. go to Operation 1003

Operation 10012 – else i.e. If there is a strong auth mismatch – perform mismatch process e.g. as in Fig. 8.

FIG. 8

Operation 10012.5: scan the whole memory 2 in Fig. 1, e.g. by redoing Operation 1006, but correct all identified errors.

Operation 10013 – redo strong auth e.g. by redoing Operations 1009 – 11.

Operation 10014 – If strong auth now fails, flag uncorrectable memory contents

FIG. 13 a. the system generates an attempted or putative or candidate correction value

b. The system attempts to replace suspected-erroneous data with the attempted or putative or candidate correction value e.g. by flipping the bit/s which, according to operation a, may be erroneous or more generally by replacing values with adjacent values as described herein.

c. The system conducts certain checks to verify or validate that the putative correction was successful, e.g. to determine whether or not the putative correction is successful.

Fig. 14a

2010. Read_R = Read flash word (including auth)

2020. Read_H = Read flash word with higher threshold value (like margin-read1) where "higher" means higher than a given, e.g. default or predetermined, threshold level.

2030. Define Check_bitsH by computing a xor of Read_R from operation 2010 and Read_H from operation 2020

2040. Iterate through bit indices (or iterate through the bits of) "Check_bitsH" one by one; for each bit index (or each bit), determine whether or not the word matches the auth.

2050. If a match is found – this typically indicates success e.g. indicates that a good correction candidate has been found. At this point, typically, the method attempts to verify or validate the "good" candidate .Otherwise e.g. if no match is found, Operations 2060 – 2090 are respectively similar to operations 2020 - 2050, except that the latter are identifying bits likely to be erroneous are among those bits deemed to be logical 0 bits, rather than (as in operations 2020 – 2050) from among bits deemed to be logical 1 bits.

Go to operation 2060 in Fig. 14b

Fig. 14b

From operation 2050 in Fig. 14a

↓

2060. Read_L = Read flash word with lower threshold value (like margin-read0).

↓

2070. Define Check_bitsL by computing a xor of Read_R from operation 2010 and Read_L from operation 2070

↓

2080. Iterate through bit indices (or iterate through the bits of) "Check_bitsL" one by one; for each bit index (or each bit), determine whether or not the word matches the auth.

↓

2090. If found a match – success - End flow.

↓

20100. Check_rest = {BitwiseNOT(Check_bitsL BitwiseOR with Check_bitsH)} // rest of the bitse.g.

20100a. Compute BitwiseOR, of Check_bitsL from operation 2070, with Check_bitsH from operation 2030

20100b. Define Check_rest by computing a BitwiseNOT of the BitwiseOR computed in operation 20100a, with Check_bitsH from operation 2030

↓

20110. Iterate through bit indices (or iterate through the bits of) "Check_bitsL" one by one; for each bit index (or each bit), determine whether or not the word matches the auth.

↓

20120. If found a match (e.g. if, in operation 20110, the word matches the auth) – success.

↓

20130. Else (e.g. if, in operation 20110, the word does not match the auth) – fail, in which case typically, the method go to a higher "instance" for recovery of the bit error (e.g. outputs an error signal indicating the need for a laboratory intervention), because no more bits are left to be checked as correction candidates hence the whole correction process has failed.

End flow.

Fig. 15 aka METHOD2:

20210. read a data region

20212: Perform a margin0 read of the data region.

20214: Perform a margin1 read of the data region.

20220: If the 3 read values generated in operation 20210 are not all identical, perform the method of Fig. 16, aka METHOD 3 on the results of the above checks.

20230: Else, i.e. if the 3 read values generated in operation 20210 are all identical, wait for next integrity check event e.g. next strong auth and return to START operation 20210. it is appreciated that a system designer may electively perform an "integrity check" e.g. strong auth, periodically or on occasion, to reconfirm the integrity of memory contents.

FIG. 16 AKA METHOD3

20310. if an error check mechanism exists (such as but not limited to signature/parity/redundancy), check errors of regular read of said data region. Output of operation 20310 is either ok or not-ok

20320: If output of operation 20310 is ok, or if no error check mechanism exists, refresh the data (e.g. by rewrite or by copying to another place e.g. depending on the mismatch and memory type)

20330: Else, i.e. output of operation 20310 is not-ok, iterate through the mismatch read bits (1-3) first, trying to flip each bit at a time and recheck error until match is found.

FIG. 17

20a. system generates an attempted or putative or candidate correction value

20b. system attempts to replace suspected-erroneous data with the attempted or putative or candidate correction value e.g. by flipping bit/s which, according to operation 20a, may be erroneous, in descending order of the bit's likelihood of being erroneous such that at least one bit more likely to be erroneous is flipped before at least one bit less likely to be erroneous

20c. The system conducts certain checks (to verify or validate that the putative correction was successful, e.g. to determine whether or not the putative correction is successful.

SYSTEM AND METHOD FOR PRIORITIZATION OF BIT ERROR CORRECTION ATTEMPTS

REFERENCE TO CO-PENDING APPLICATIONS

This application is a continuation-in-part of U.S. patent application Ser. No. 16/423,676 "Improved system and method for correction of memory errors" filed on May 28, 2019.

FIELD OF THIS DISCLOSURE

The disclosure relates to maintaining integrity of memory in semiconductor devices and, more particularly, in non-volatile memory (NVM).

BACKGROUND FOR THIS DISCLOSURE

Non-volatile memory (NVM) semiconductor memory devices, which retain bits of data even when the supply of electricity to the device containing the NVM cells is interrupted or terminated, are ubiquitous, including flash memory devices, floating gate devices, nitride read only memory (NROM) and other charge-trapping devices. In contrast, some semiconductor memory devices, like static random access memory (SRAM), are "volatile", losing their data when power is terminated.

Multi-bit information stored in an NVM cell may be represented by states of NVM cell threshold voltage levels. The plural bits may be stored on a single cell e.g. by programming the cell's threshold voltage to intermediate levels. In multi-level cells for example, typically n bits in a single cell use $2^n-1$ threshold levels. The difference in voltage between adjacent levels lessens, if n>1 rather than 1 bits are stored on a single cell, and disturbing a cell from one threshold voltage state to a next higher or next lower state becomes particularly likely. Thus an NVM cell's state may be defined and determined by its threshold voltage (Vt), the voltage at which the cell begins to conduct current, but sensing the difference between states, may be error-prone. this thresholding applies of course not only to multi-level cells, but also to single level cells for which n=1 for 1 bit such that $2^n-1$ is 1 for 1 threshold.

NVM cells can typically be "programmed" (and also "erased", and read"). Programming may comprise applying voltages to memory cell terminals which inject electrons e.g. into a charge storage layer of an FG, or into a charge trapping layer of an NROM. The threshold voltage (Vt) of the relevant layer then increases. Threshold voltages (Vts), or ranges thereof, are respectively associated with states or program levels of an NVM cell. Thus, each memory cell may be programmed to various states, or program levels depending on the threshold voltage of the cell. For a single level cell there are only two program levels which may be termed "erase" and "program", but in a multi-level cell (MLC) there are n>2 program levels.

The term "NVM thresholds" is used in the literature to include various physical values, used for various purposes, in various ways. For example:
https://docs.microsoft.com/en-us/windows-hardware/drivers/storage/get-nvm-thresholds-function-index-5-
https://www.researchgate.net/figure/Natural-VT-VT0-distribution-of-a-typical-512k-bit-array-from-two-different-NVM_fig1_3997562
U.S. Pat. No. 7,626,868B1
US20130235661A1.
And https://patents.google.com/patent/US20180062668A1/en to Moon et al.

Moon et al complains that "once neighbouring threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when neighbouring threshold voltage distributions overlap, a memory cell that has the third program state 'P3' may be erroneously determined to have the second program state 'P2'. In short, when the neighbouring threshold voltage distributions overlap as illustrated in FIG. 2, read data may include a significant number of errors" and therefore, moon strives for "more accurately reading data stored in multi-bit memory cells of highly integrated semiconductor memory devices".

Margin-read (aka read margin) technologies and uses thereof are known, for memories such as NVM, e.g. flash or EEPROM, and are described, e.g. in the following: https://www.rfidjournal.com/blogs/experts/entry?12162 https://www.nxp.com/docs/en/application-note/AN1827.pdf
https://patents.google.com/patent/US20150255164A1/en (Texas Instruments) https://www.silabs.com/community/mcu/8-bit/knowledge-base.entry.html/2016/03/31/c8051t616_marginrea-wjZg
http://www.ti.com/lit/an/spna091a/spna091a.pdf for example, states that "TMS470 microcontroller devices built using the F05 flash process have a built-in mechanism for detecting weak or degraded flash bits before they fail."

The reference describing allowing "the user to select one of two modes for checking flash cells: read margin one mode or read margin zero mode. These modes effectively change the reference current used to determine if a bit is a 1 or a 0 .... For example, in the normal read mode, if a cell passes less than the reference current when 5.0 V are applied to the gate, the cell is a 0. If the cell passes more than the reference current when 5.0 V are applied to the gate, the cell is a 1. In read margin zero mode, the current ratio is changed such that it is equivalent to applying 5.2 V to the gate. This voltage checks that the programmed cells have at least 200 mV of margin before the bit might flip to a 1. Normal programmed cells will have a threshold voltage (Vt) of 6.5 V or more. In read margin one mode, the current ratio is changed such that it is equivalent to applying 4.8 V to the gate. This voltage checks that the erased cells have at least 200 mV of margin before the bit might flip to a 0. Normal erased cells will have a Vt of 4.5 V or less . . . . (B)oth read margin zero and read margin one tests should be run to guarantee properly functioning flash. https://pdfs.semanticscholar.org/647a/7419dadd3323 e9e2d78a9b57a2bb26043fbc.pdf analyses SRAM read margin on the basis of Static Noise Margin analysis.

Typically, although not necessarily, the output of a margin-read operation includes binary values each indicative of a respective bit's strength. The output may be 1 if the changed threshold changed the read, and zero otherwise, in which case each 1 in the output of the margin-read indicates a "weak" bit, and each 0 in the output of the margin-read indicates a "strong" bit.

SUMMARY OF CERTAIN EMBODIMENTS

Certain embodiments seek to improve data integrity in memory devices such as NVMs which support Margin Read.

Certain embodiments seek to optimize trial and error flows in NVM systems by reducing expenditure of time and power.

Certain embodiments seek to utilize level information to prioritize error correction candidates by determining which bit(s) is or are most likely to be erroneous (relative to other bits which are less likely to be erroneous).

Certain embodiments seek to improve data integrity in memory devices such as NVMs which support Margin Read.

Certain embodiments seek to prioritize bits for error correction, e.g. to reduce overall correction cycle time, regardless of which error correction method is used. This may include handling bits which are more likely to be erroneous, before bits which are less likely to be erroneous, e.g. by ranking bits according to each bit's response to margin read.

According to certain embodiments, a system becomes aware of an error in a given word in the memory e.g. by virtue of an authentication (aka auth) operation. According to certain embodiments, the error could be in various of the word's bits, and logic is provided which uses a trial and error process: the logic flips various bits in the word and determines which of those bits is that which properly corrects the error. These systems are advantageous because once that bit is flipped, the error is fixed without having to send the device to a repair lab.

While the bits may be flipped in any order e.g. in the physical order of the bits or any random order, according to certain embodiments, bits which are most likely to be erroneous, are flipped before bits which are least likely to be erroneous. Thus, optimization is achieved because, statistically, less bits are flipped in the long run, since the optimization increases the likelihood of finding the "bad" bit at an early stage.

The system may use any suitable criterion to determine which bits are more/less likely to be erroneous. One criterion utilizes the fact that many memories (e.g. NVMs) have "margin read" functionality which indicates how "strong" a given bit's logical zero is, or one value: if the bit is healthy, the voltage of that bit is very far from the threshold that differentiates 0 from 1, and therefore, that bit's one (or zero) is "strong". If the bit is marginal or weak, the margin read may indicate that the voltage of that bit is not very far from the threshold that differentiates 0 from 1, and therefore, that bit's one (or zero) is not "strong".

Certain embodiments suggest that error correction logic, which performs a trial and error method for determining which bit is the "culprit", may harness the "margin read" functionality. This will allow the logic to first flip the old non-healthy bits, and only later flip the healthy bits.

Certain embodiments seek to provide a system for testing possible corrections of memory errors, using memory authentication functionality not only to identify errors, but also to verify (or not) various possible corrections.

Certain embodiments seek to provide a method for error correction, including applying at least one possible error correction, and then using an integrated circuit's existing authentication functionality to verify whether the possible error correction is correct.

Certain embodiments seek to provide an error correction solution which, unlike conventional error correction solutions, does not generate overhead in memory (as opposed, say to ECC, which requires x bits to be stored per y amount of data). This is because "evaluation" of the data utilizes authentication, an existing functionality in conventional, e.g. security- and integrity-aware memory management, which inevitably involves its own overhead and is harnessed as described herein for error correction, such that typically no overhead, over and above the authentication's natural overhead, is required.

It is appreciated that applicability of embodiments herein extends inter alia to any general microcontroller performing any function/s, that has a processor and memory. These functions are typically operated by the firmware executed by the processor; the firmware resides in the memory and may itself be (included in) the memory content that is sought to be secured.

It is appreciated that certain embodiments herein may be used with a legacy IC, parsimoniously utilizing (portions of) the legacy IC's own legacy auth whose crypto computations may be done either in hardware or firmware; hardware is typically provided for storing the auth digests. Firmware using regular CPU instructions may be employed, or HW accelerators may be used. For example, if HMAC is used for the strong auth, and the legacy IC has a piece of crypto hardware operative to perform HMAC, the firmware may utilize this piece of legacy hardware in the legacy IC if the legacy hardware is accessible for the processor of the subject IC, hence accessible for the firmware the processor is executing.

Alternatively or in addition, (portions of) access control functionality in the IC's legacy hardware and/or firmware may be employed.

Alternatively or in addition, an existing IC's legacy HW and/or FW are not employed to implement the embodiments herein and instead, (some or all of) the functionality described herein is implemented in suitable FW which is added to the mutable code of the existing IC's legacy FW.

There are thus provided at least the following embodiments:

Embodiment 1. A self-correcting memory system comprising:

an integrated circuit including memory and memory content authentication functionality, which is operative to compare content to be authenticated to a standard and to output "authentic" if the content to be authenticated equals the standard and "non-authentic" otherwise; error correction functionality which is operative to apply at least one possible correction to at least one erroneous word entity in the memory, yielding a possibly correct word entity, to call the authentication for application to the possibly correct word entity, and if the authentication's output is "authentic", to replace the erroneous word entity in the memory, with the possibly correct word entity thereby to yield error correction at a level of confidence derived from the level of confidence associated with the authentication.

It is appreciated that comparison of content to be authenticated to a standard typically involves computing some derivative of the content to be authenticated, such as a digest thereof, and comparing that derivative (rather than directly comparing the actual raw content) to a standard.

Embodiment 2. A system according to any of the preceding embodiments wherein the authentication functionality is operative to perform cryptographically strong authentication.

Embodiment 3. A system according to any of the preceding embodiments wherein the authentication functionality is also operative to perform word-authentication.

Embodiment 4. A system according to any of the preceding embodiments wherein the error correction functionality is configured for:

applying at least one possible correction to at least one erroneous word in the memory, yielding a possibly correct word, calling the word-authentication for application to the possibly correct word, if the word-authentication's output is "authentic", to subsequently call the strong authentication for application to the possibly correct word, and if the strong-authentication's output is "authentic", to replace the erroneous word in the memory, with the possibly correct word, thereby to yield error correction at a level of confidence derived from the level of confidence associated with the strong authentication and/or word-authentication.

Embodiment 5. A system according to any of the preceding embodiments wherein the erroneous word is detected by word-authentication applied to at least one word in the memory, and wherein any word which yields a "non-authentic" output is considered erroneous and any word which yields an "authentic" output is considered non-erroneous.

Embodiment 6. A system according to any of the preceding embodiments wherein the correction comprises a flip of at least one bit in the erroneous word entity from 0 to 1 or from 1 to 0.

Embodiment 7a. A system according to any of the preceding embodiments wherein possible corrections are applied to plural erroneous words yielding plural possibly correct words, and wherein the strong authentication is called once for application to a revised memory image/chunk in which all of the plural erroneous words are replaced with the possibly correct words respectively, rather than calling the strong authentication plural times for application to memory images/chunks respectively including the plural possibly correct words respectively, thereby to save memory and/or correction time.

Embodiment 7b. A system according to any of the preceding embodiments wherein possible corrections are applied to plural erroneous words yielding plural possibly correct words, and wherein the strong authentication is called once for application to all of the plural possibly correct words rather than calling the strong authentication plural times for application to the plural possibly correct words respectively, thereby to save memory and/or correction time.

Embodiment 8. A system according to any of the preceding embodiments wherein at least first and second possible corrections are applied to at least one erroneous word and wherein any bit in the erroneous word which is flipped in the first correction is unflipped before the second possible correction is applied to the erroneous word, thereby to undo the first possible correction of the erroneous word before applying the second possible correction to the same erroneous word.

Embodiment 9. A system according to any of the preceding embodiments wherein all possible corrections are applied to at least one erroneous word.

Embodiment 10. A system according to any of the preceding embodiments wherein the erroneous word to which all possible corrections are applied comprises an erroneous word for which none of the possible corrections tried results in correct word authentication, until the last possible correction is tried, in which case the erroneous word is regarded as uncorrectable.

Embodiment 11. A system according to any of the preceding embodiments wherein at least one heuristic is employed to determine a subset of possible corrections including less than all possible corrections and wherein only possible corrections in the subset are applied to at least one erroneous word, even if none of the possible corrections in the subset results in correct word authentication.

It is appreciated that heuristics may be used to generate a subset of candidate corrections aka possible corrections, and/or may be used to prioritize candidate corrections, such that the right corrections, for a given use-case, are more likely to be found earlier, whereas less likely corrections are tested only later (e.g. only if the more likely corrections are not verified).

Typically, if a given subset of priority possible corrections are not verified, the system defaults to the rest of the possible corrections (which were deemed lower priority because they were deemed less likely, a priori, to be verified).

Embodiment 12. A system according to any of the preceding embodiments wherein the authentication functionality, operative to compare content to be authenticated to a standard, is operative to apply strong auth to the content to be authenticated which is stored at a given memory location, at a time t2, thereby to yield a "computed" auth value, and to compare the computed auth value to a stored result, aka expected auth value, generated by applying strong auth to content of the memory, at the given memory location, at a previous time t1 earlier than t2.

Embodiment 13. A method providing error correction functionality for memory content which resides on an integrated circuit's target (non-volatile or volatile) memory, the method comprising at least once:

b. Detecting an error in memory content residing in target memory c. Searching, through at least some bit-permutations constituting respective possible fixes of the error, for at least one on-the-fly signature match, thereby to define a proposed fix which achieves successful strong auth, d. If at least one on-the-fly signature match is found, using overall authentication as a final verification for the proposed fix, e. If verified, correcting the code, using a power-fail safe code recovery update process, thereby to provide error correction for the target memory without taking the target memory to a lab.

Embodiment 14. A method according to any of the preceding embodiments and also comprising providing an output indication that memory recovery is needed e.g. by taking at least the target memory to a lab for complete reprogramming, because memory content correction has failed.

Embodiment 15. A method according to any of the preceding embodiments wherein, before providing the output indication, the searching is performed only over single-bit permutations of the error.

Embodiment 16. A method according to any of the preceding embodiments wherein, before providing the output indication, the searching is performed over all single-bit and double-bit permutations of the error.

Embodiment 17. A method according to any of the preceding embodiments wherein, before providing the output indication, the searching is performed over all single-bit permutations of the error, and if no match is found, then the searching is again performed, this time over at least some double-bit permutations of the error.

Embodiment 18. A method according to any of the preceding embodiments and also comprising protecting memory content residing on target memory, before the detecting, both by strong-auth performed once, and by on-the-fly word auth.

Embodiment 19. A method according to any of the preceding embodiments wherein the strong-auth performed once comprises strong-auth performed just after the integrated circuit wakes up from a less active state.

Embodiment 20. A method according to any of the preceding embodiments wherein the strong-auth performed once comprises strong-auth performed just after the integrated circuit powers-up.

Embodiment 21. A method according to any of the preceding embodiments wherein the strong-auth performed once comprises strong-auth performed just after the integrated circuit exits a sleep state.

Embodiment 22. A method according to any of the preceding embodiments wherein the memory content comprises code stored in the target memory.

Embodiment 23. A system according to any of the preceding embodiments wherein the error correction functionality is operative to apply at least one possible correction to at least one erroneous word in the memory, yielding a possibly correct word, calling the authentication for application to the possibly correct word, and if the authentication's output is "authentic", to replace the erroneous word in the memory, with the possibly correct word.

Embodiment 24. A system according to any of the preceding embodiments wherein the error correction functionality is operative to apply at least one possible correction to at least one erroneous word entity's word auth, yielding a possibly correct word entity, calling the authentication for application to the possibly correct word entity, and if the authentication's output is "authentic", to replace the erroneous word auth in the memory, with the possibly correct word auth.

Embodiment 25. A system according to any of the preceding embodiments wherein the previous time t1 is a time at which a firmware update of the memory occurred.

Embodiment 26. A computer program comprising instructions which, when the program is executed by a processor, cause the processor to carry out one or more operations within one or more of the above methods.

Embodiment 27: A system comprising at least one processor, typically operative in conjunction with corresponding, dedicated hardware, configured to carry out at least one of the operations of one or more of the methods herein.

Also provided are at least the following embodiments:

Embodiment 101. A method for prioritizing trial-and-error attempted corrections of at least one bit, in a memory, in which logical bit levels are determined by thresholding voltage values using at least one threshold, the method comprising:

ranking plural bits such that a first bit from among the plural bits is ranked before a second bit, from among the plural bits, which is less likely than the first bit to be erroneous and sequentially attempting to correct the plural bits in order of the ranking, thereby to define plural attempted corrections, including attempting to correct the first bit which is more likely than the second bit to be erroneous, before attempting to correct the second bit, which is less likely to be erroneous.

Embodiment 102. The method according to claim 1 wherein the memory includes single-level cells aka binary (0/1) cells, and wherein the sequentially attempting comprises sequentially flipping the plural bits, thereby to define plural attempted bit-flips, in order of the ranking, including flipping the first bit which is more likely than the second bit to be erroneous, before the second bit, which is less likely to be erroneous, is flipped.

Embodiment 103. The method according to any of the preceding embodiments and also comprising detection of a bit error in the at least one bit and wherein the detection triggers the ranking and the sequential attempting.

Embodiment 104. The method according to any of the preceding embodiments wherein the memory is aboard a chip and wherein the chip comprises an NVM.

Embodiment 105. The method according to any of the preceding embodiments wherein the plural bit-flips continue until one of the following occurs:

all bits have been flipped;

an attempted bit-flip from among the plural bit-flips is determined to have been successful in correcting the error.

Embodiment 106. The method according to any of the preceding embodiments wherein the plural attempted corrections continue until one of the following occurs:

attempts have been made to correct all bits;

an attempted correction from among the plural attempted corrections is determined to have been successful in correcting the error.

Embodiment 107. The method according to any of the preceding embodiments wherein the memory chip has legacy authentication functionality and wherein the sequentially attempting to correct e.g. sequential flipping continues until one of the following occurs:

attempts have been made to correct all bits e.g. all bits have been flipped;

the legacy authentication functionality determines that an attempted correction e.g. bit-flip from among the plural attempted corrections e.g. bit-flips is successful in correcting the error.

Embodiment 108. The method according to any of the preceding embodiments wherein the ranking comprises assigning higher correction priority to ones than to zeros, if successful 1-to-0 corrections are more numerous than 0-to-1 corrections.

Embodiment 109. The method according to any of the preceding embodiments wherein the ranking comprises assigning higher correction priority to zeros than to ones, if successful 1-to-0 corrections are less numerous than 0-to-1 corrections.

Embodiment 110. The method according to any of the preceding embodiments wherein the ranking comprises determining a distance of a voltage reading of each of plural bits to be corrected, from a respective voltage threshold used to convert the voltage reading into a logical bit value.

Embodiment 111. The method according to any of the preceding embodiments wherein the ranking comprises determining a distance of a voltage reading of each of plural bits to be flipped, from a respective voltage threshold used to convert the voltage reading into a logical bit value.

Embodiment 112. The method according to any of the preceding embodiments wherein the sequentially attempting to correct includes attempting a first attempted correction from among the plural attempted corrections before a second attempted correction, when the distance, for the first attempted, is smaller than the distance, for the second attempted correction.

Embodiment 113. The method according to any of the preceding embodiments wherein the sequentially flipping includes attempting a first bit-flip from among the plural attempted bit-flips before a second bit-flip, when the distance, for the first bit-flip, is smaller than the distance, Embodiment 114. The method according to any of the preceding embodiments wherein the respective voltage threshold is closest to the voltage reading, from among at least one voltage threshold/s used as cut-off points to convert the voltage reading into a logical bit value.

Embodiment 115. The method according to any of the preceding embodiments wherein the memory is aboard a chip and wherein code performing the method is provided as firmware running inside the chip.

Embodiment 116. The method according to any of the preceding embodiments wherein the chip has margin read functionality and wherein the firmware uses the Margin Read functionality to determine the distance of the voltage reading of each bit to be corrected e.g. flipped, from the respective voltage threshold.

Embodiment 117. A system for prioritizing trial-and-error attempted corrections of at least one bit, in a memory, in which logical bit levels are determined by thresholding voltage values using at least one threshold, the system comprising:

circuitry configured for ranking plural bits such that a first bit from among the plural bits is ranked before a second bit, from among the plural bits, which is less likely than the first bit to be erroneous and a controller configured for sequentially attempting to correct the plural bits in order of the ranking, thereby to define plural attempted corrections, including attempting to correct the first bit which is more likely than the second bit to be erroneous, before attempting to correct the second bit, which is less likely to be erroneous.

The following terms may be construed either in accordance with any definition thereof appearing in the prior art literature or in accordance with the specification, or to include in their respective scopes, the following:

Access control: intended to include any conventional access control functionality, typically associated with the interface between processor and memory, may be implemented as a virtual-logical entity including hardware and firmware.

Target memory: may include any memory array within an integrated circuit aka IC, the array typically including pages of memory, some in use, and some free. Any free page not currently in use, may be considered a *reserved* page.

When using a reserved page e.g. as a very short term warehouse while updating memory pages, the method typically verifies that what the reserved page contains is exactly what was written to it (e.g. by comparing the contents of the reserved page in real time to the data that was copied to the reserved page and ensuring both are identical). If this is not the case, the reserved page's content should be erased and redone by rewriting onto the reserved page. Verification may include reading the reserved page right after writing thereupon to ensure that writing was successful, resulting in data being stored on that reserved or spare page that is correct e.g. exactly what was written.

'strong authentication' (aka 'strong auth'): may include an algorithm or process which authenticates memory content; may employ digest/secured key-based HASH function, like HMAC aka Hash-based message authentication code or CMAC aka Cipher-based Message Authentication Code, e.g. on a large code or persistent data segment. The authentication code used for strong auth may be based on a secure hash function such as SHA (SHA-1, SHA-2) or HMAC (e.g. https://en.wikipedia.org/wiki/Secure_Hash_Algorithms).

Typically, 'strong auth' herein yields a single value that vouches for an entire data section or image or image chunk representing content to be secured [such as but not limited to code] which enables integrity of content of an entire data section or image or image chunk to be verified not just for a specific corresponding row or column as in conventional 2D horizontal/vertical error correction schemes.

Typically strong auth authenticates memory content at a higher level of confidence than word auth. Thus "Strong auth" as used herein is intended to include any algorithm or any message authentication code scheme which produces a digest which is small e.g. relative to that of the "word auth" algorithm referred to herein, thus, as opposed to word auth, may be regarded as irreversible, i.e. impossible to reproduce the original plaintext from the digest.

Typically, after rectifying or correcting an error in a specific data word within the memory content (which may be identified by auth), and replacing the data+auth with the rectified data+auth, the strong auth for the whole contents is recomputed and compared to the stored, pre-computed strong auth or digest.

Strong-auth is typically applied to a given body of data (in which at least one erroneous word is replaced with its proposed correction respectively) e.g. to an entire memory image or to only a chunk thereof, depending on the body of data to which the recomputed strong auth is to be compared e.g. depending on whether the stored, pre-computed strong auth to which the recomputed strong auth is to be compared, was pre-computed on the entire memory image (in which, typically, an erroneous word is replaced with its proposed correction) or only on a chunk thereof (ditto). The strong auth is typically considered "successful" if the re-computed strong auth and the pre-computed, aka expected strong auth, are exactly equal.

'strong auth' may occur upon FW request which is typically from the application system, aka higher level system utilizing and incorporating the integrated circuit (see FIG. 1). Alternatively or in addition, 'strong auth' may occur upon request from application FW being executed on a given IC (integrated circuit) containing the memory content in which it is sought to correct errors. Typically, the recipient of the request is operative to re-authenticate itself responsive to a certain trigger (e.g. as per FIG. 12) resulting from events such as, say, an attack identified in some other IC or system element. The higher level system is thus one possible source of requests to perform functionalities described herein, such as authentication e.g. strong auth, and so may be firmware and hardware events within the IC.

word: may include any piece of data which is much smaller than the memory is e.g. 16 bits of data, or 128 or 256 bits of data, or more, out of a memory array which may contain, say, thousands of words. Typically, a word is the smallest piece of data retrieved from memory, which has its own auth code.

Word auth aka signature match: may include a digest of the "word" being authenticated.

on-the-fly signature match: Every time a word is read, the word auth should be read at the same time. Typically, the bit structure's length is the length of the data plus the length of the auth. At the same time, the auth is re-computed based on the word as read, and is then compared to the auth read with the word. Match occurs when the re-computed auth equals the auth read from memory.

Overall authentication: may include strong auth, which operates on the entire contents of the memory that a system seeks to manage. Typically, if the digest of the contents at any time, and specifically after data correction, is the same as pre-computed, then the content now, at the time of re-authentication, can be regarded as identical to the content at the time of pre-computation hence strong-auth is successful, hence, in case executed immediately after data correction, the proposed correction or proposed fix is correct or authenticated or confirmed.

Digest: may include algorithm (used e.g. for strong auth) which generates a hash from content, the hash enabling the integrity of the content to be verified e.g. whether or not the content has changed or (for memory with controlled access) has undergone an unauthorized change, or has been tampered with. Thus digest and hash are used generally interchangeably herein, and are used both as a noun and a verb.

HMAC algorithm: typically, a MAC algorithm that uses a hash (rather than, say, encryption), internally, to generate a MAC.

on-the-fly: e.g. concurrently with another ongoing process. For example, in authentication, a digest may be computed and compared to an expected value while data to be authenticated is still being read, or may be computed and written to the memory during the write operations (of the content).

For example, on-the-fly encryption, decryption and authentication are described in the following co-pending patent document, the disclosure of which is hereby incorporated by reference:

https://patents.google.com/patent/US9525546B2/en error verification: may include determining whether there is a match or a mismatch (equal or non-equal) between computed "strong auth" of memory at time t2 and pre-computed/stored (aka expected) "strong auth" computed over the same memory zone, at time t1 which precedes time t2.

Typically, the pre-computed strong auth comprises a strong auth digest for the entire contents of the memory space or array whose integrity is sought to be protected using embodiments herein.

Stacked flash: may include a chip, which may be referred to as a "vertical" or "3d" chip, which yields ultra-high density storage and reduces bit costs by having plural (sometimes dozen) of layers or dies of memory deployed one atop another. May use BiCS (Bit Cost Scaling) or a punch and plug process. It is appreciated that the embodiments herein are applicable to memory in general, including but not limited to stacked flash and other flash/NVM technologies.

Overhead: may include redundancy in memory capacity which is typically disadvantageous e.g. in terms of die area and/or product cost. For example, implementing error correction with error correction codes (ECC) typically means X bits of ECC added to Y bits of data/auth info, translating to overhead or extra memory capacity of (Y/X)*100% for error correction.

word entity: may include data stored about a word in memory, including the word itself (aka word bits), plus word auth (aka auth bits) relating to that word; the word auth is termed herein the word's "corresponding" word auth. According to certain embodiments, the bits in the word portion and the bits in the auth portion are both scanned or flipped, but for the word, computations are typically performed, whereas for the auth, comparisons are typically performed, all e.g. as described herein.

The following acronyms are employed herein: ECC (Error-correcting code); FW (firmware), NVM (non-volatile memory), ASIC (application-specific integrated circuit), DSP (digital signal processing) and HMAC (hash-based message authentication code), IC (integrated circuit), and HW (hardware).

Embodiments referred to above, and other embodiments, are described in detail in the next section.

Any trademark occurring in the text or drawings is the property of its owner and occurs herein merely to explain or illustrate one example of how an embodiment of the invention may be implemented.

Unless specifically stated otherwise, as apparent from the following discussions, it is appreciated that throughout the specification discussions, utilizing terms such as, "processing", "computing", "estimating", "selecting", "ranking", "grading", "calculating", "determining", "generating", "reassessing", "classifying", "generating", "producing", "stereo-matching", "registering", "detecting", "associating", "superimposing", "obtaining" or the like, refer to the action and/or processes of at least one computer/s or computing system/s, or processor/s or similar electronic computing device/s, that manipulate and/or transform data represented as physical, such as electronic, quantities within the computing system's registers and/or memories, into other data similarly represented as physical quantities within the computing system's memories, registers or other such information storage, transmission or display devices. The term "computer" should be broadly construed to cover any kind of electronic device with data processing capabilities, including, by way of non-limiting example, personal computers, servers, embedded cores, computing systems, communication devices, processors (e.g. digital signal processor (DSP), microcontrollers, field programmable gate array (FPGA), application specific integrated circuit (ASIC), etc.) and other electronic computing devices.

Elements separately listed herein need not be distinct components and alternatively may be the same structure. A statement that an element or feature may exist is intended to include (a) embodiments in which the element or feature exists; (b) embodiments in which the element or feature does not exist; and (c) embodiments in which the element or feature exist selectably e.g. a user may configure or select whether the element or feature does or does not exist.

BRIEF DESCRIPTION OF THE DRAWINGS

Certain embodiments of the present invention are illustrated in the following drawings:

FIG. 2 is a simplified flowchart illustration of a flow for combining authentication with error correction.

FIG. 3 is a simplified flowchart illustration of an example flow for performing operation 30 in FIG. 2.

FIG. 4 is a simplified flowchart illustration of an example flow for carrying out error correction and verification when the memory is page-based nonvolatile memory.

FIG. 5 is a simplified flowchart illustration of an example flow for performing operation 220 in FIG. 4.

FIG. 6 is a simplified flowchart illustration of a flow for operation of the integrated circuit of FIG. 1.

FIG. 7 is a simplified flowchart illustration of a suitable error correction sequence flow, including testing possible error corrections.

FIG. 8 is a simplified flowchart illustration of an example flow for performing operation 10012 in FIG. 7.

FIG. 13 is a simplified flowchart illustration of trial-and-error based error correction, typically triggered by detection of an error, of which the system of FIGS. 1-12 is an example.

FIGS. 14a-14b, 15 are simplified flowchart illustrations of methods which, given an erroneous word having b bits, and given a "trial and error" method e.g. as in FIG. 13 which involves flipping (some or all of) the B bits [Lost you here. Are B and b the same thing?], resulting in B or less putative corrections, in an attempt to identify a verified bit flip which corrects the bit error, providing threshold-level based prioritization of certain bits over others. FIGS. 14a-14b, taken together, are configured for ordering/ranking the bits in terms of most/least likely to succeed. FIG. 15 is a method for bit error prevention which may be performed on occasion e.g. periodically, e.g. for preventative memory maintenance, e.g. to identify bits likely to fail soon, e.g. in order to provide such bits with preventative treatment.

FIG. 16 is a simplified flowchart illustration of a method for error correction and memory contents refresh.

FIG. 17 is a simplified flowchart illustration of trial-and-error based error correction which is similar to FIG. 13 but bits are flipped in descending order of the bit's likelihood of being erroneous.

Methods and systems included in the scope of the present invention may include some (e.g. any suitable subset) or all of the functional blocks shown in the specifically illustrated implementations by way of example, in any suitable order e.g. as shown.

Computational, functional or logical components described and illustrated herein can be implemented in various forms, for example, as hardware circuits such as but not limited to custom VLSI circuits or gate arrays or programmable hardware devices such as but not limited to FPGAs, or as software program code stored on at least one tangible or intangible computer readable medium and executable by at least one processor, or any suitable combination thereof. A specific functional component may be formed by one particular sequence of software code, or by a plurality of such, which collectively act or behave or act as described herein with reference to the functional component in question. For example, the component may be distributed over several code sequences such as but not limited to objects, procedures, functions, routines and programs, and may originate from several computer files which typically operate synergistically.

Any logical functionality described herein may be implemented as a real time application, if and as appropriate, and which may employ any suitable architectural option such as but not limited to ASIC or DSP or any suitable combination thereof. Any hardware component mentioned herein may in fact include either one or more hardware devices e.g. chips, which may be co-located or remote from one another.

DETAILED DESCRIPTION OF CERTAIN EMBODIMENTS

IC makers are eager to secure the contents of their integrated circuits' memories.

The embodiments herein are applicable to memories of many different technologies, hence the term "flash" when used herein is used only by way of example.

A system for ensuring integrity of memory content, in ICs, is described in detail. Typically, access to such memory is controlled; a digest may be used to sign a controlled, hence authorized memory update. Thus, any change in the memory which is not a result of that controlled access, is an undesirable error, whether malicious or, perhaps, due to a transitional physical or electrical failure e.g. of the physical memory itself. The system herein is operative to test possible corrections for errors, reducing "out-of-order" time for the computer or other product in which the integrated circuit is embedded. Typically, (one or more levels of) authentication functionality, which the integrated circuit typically needs for other purposes anyhow, is used to verify or approve possible corrections, such as using word-auth for discovering errors and initially verifying proposed corrections thereof, and using strong-auth for finally verifying proposed corrections.

Figure 1:
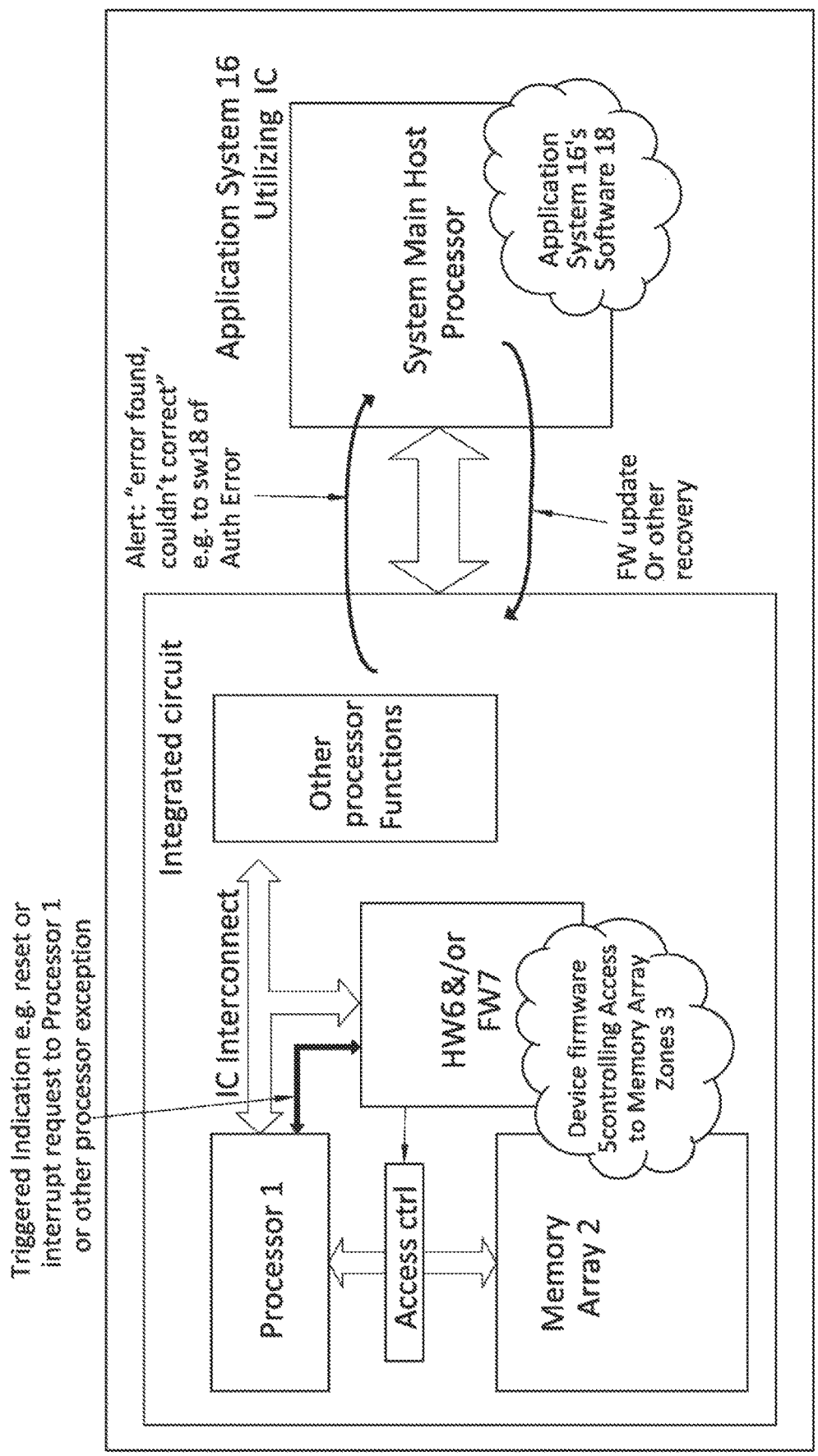
FIG. 1 is a diagram of an integrated circuit which has some function/s (aka "other functions") to fulfill and which has error correction functionality, including functionality which harnesses authentication for testing possible error corrections, all according to an embodiment of the invention.

Certain embodiments provide error detection and recovery (aka error correction) functionality in integrated circuits whether by providing integrated circuits such as that shown in FIG. 1, or by modifying existing integrated circuits e.g. by adding software over the existing ICs. The software may reside in another, typically independent memory space of the same IC, having access authorization to the memory space the system seeks to secure and typically being operative to perform auth e.g. word auth and/or strong auth and/or to accomplish the error correction and/or verification thereof e.g. as described herein.

Certain embodiments provide error detection and recovery functionality in integrated circuits including detection (e.g. based on conventional authentication) for identifying events in which memory content has been altered, and recovering from these events to enable the IC (and the device e.g. pc in which the IC is embedded) to continue operating as usual with as little as possible overhead for the end-user of the device. This is particularly advantageous because this means that some events, which today cause a PC, for example, which an end-user is working on, to "break", and necessitates the end-user to take his computer to a lab to fix, will not need this according to certain embodiments described herein, because the component with the memory fault rectifies itself by itself, thereby maintaining the security of the system.

The error correction functionality may be implemented as any suitable combination of HW and FW. The memory is typically configured to support the structure of auth+word auth. Typically, on-the-fly word auth is implemented in hardware (while reading the memory). The strong auth is typically implemented in firmware, typically using suitable crypto HW to accelerate the process. bit flipping+consistency check may be implemented in either FW or HW. The actual update of memory contents to correct an error is typically done by FW, in view of the complex operations, e.g. NVM erase and re-write, which are sometimes involved.

The system of FIG. 1 shows an integrated circuit according to certain embodiments, which may be embedded in a higher level system 16. The higher level system 16 of FIG. 1 is one possible source of requests to perform functionalities described herein, such as authentication e.g. strong auth. Alternatively or in addition, the higher level system may serve as an access path via which the memory array 2 in FIG. 1 legitimately gets its original contents (e.g. code stored in the memory array 2) or is subsequently updated, i.e. the memory array's content is replaced with different content.

Access control functionality (e.g. as shown in FIG. 1) is, typically, a combination of HW and FW. Typically, there is HW which defines which memory zones can and cannot be accessed. Firmware may, at a certain privilege level, have access to that HW which controls memory access. Thus, updating memory content may be done by "convincing" the FW that permission to do so exists, in which case the FW would open the gate and update the memory.

Functionality for testing possible error corrections e.g. as per the method of FIG. 7, may comprise a separate state machine which may be implemented, say, in hardware or firmware (see HW 6 and/or FW 7 in FIG. 1). Also, the logic of the error correction functionality may also be implemented in any suitable combination of hardware and firmware.

The system of FIG. 1, or any subset of the blocks illustrated therein, may be provided in conjunction with all or any subset of the embodiments of FIGS. 1, 9, 10 and 11; and/or in conjunction with all or any subset of the flows illustrated in FIG. 2 onward.

FIG. 2 onward illustrate schemes or methods for combining authentication with error correction which is economical in terms of memory overhead, since conventional ECC requires memory capacity for storing ECC bits per piece of data. In contrast, embodiments herein obviate use or storage of error detection or correction code by utilizing on-the-fly (say) authentication which exists in an existing design, or must be provided in a new design, in any event, for error correction, without compromising security level. The security level is typically not at all compromised because, when using ECC, an attacker may modify both data and its ECC, such that no error is identified in real time because both the data and ECC are revised to match one another. Instead, the system may only identify an error when either word auth or strong auth is executed.

It is appreciated that the term overhead may be used herein to include storage needs engendered by authentication, or by error correction, or other memory management processes which may be stored in any suitable location. For example, in word auth (aka word-level auth) or word ECC, the memory may be produced with a wider word length, thus the auth/ECC may be stored right next to the word, such that when reading the word, the auth/ECC bits are accessed as well. Or, in hardware systems, an additional memory component read may be implemented concurrently with reading the actual payload desired (as opposed to its auth/ecc bits), to allow effectively greater word length since the memory's entire word length may then be devoted to the actual payload, with the payload's auth/ecc bits stored elsewhere.

The method of FIG. 2 may include all or any subset of the following operations, suitably ordered e.g. as shown.

10: Provide an integrated circuit in which memory content e.g. code stored in memory, is protected by both:
  Power-up 'strong auth' (e.g. HMAC or CMAC, say on a large code segment)—e.g., against cold flash content replacement
  On-the-fly 'word auth' (say 128 bit payload+16 bit auth)—e.g., against hot flash content replacement e.g. when executing code straight from flash.
  On-the-fly encryption, decryption and authentication are described in the following co-pending patent document, the disclosure of which is hereby incorporated by reference:
  https://patents.google.com/patent/US9525546B2/en

20: Each time on-the-fly word auth fails (e.g. during runtime), the integrated circuit halts (e.g. until next power-up) or is automatically restarted. For example, assume there is code in the memory space that is to be secured. Reading from the memory thus typically means that a processor in the IC is fetching code from that memory space, which in turn typically means that if a word auth failure is identified, the subject processor just fetched altered code. At this point the processor may be halted, to prevent execution of altered code, and recovery typically needs to start. Recovery may include, say, jumping to another code which is known to be 100% secure, e.g. code in ROM, or resetting to restart execution from ROM, which triggers error correction and/or verification e.g. as described herein, whether by software or by hardware.

30: On next power-up (or as per the above example) all 'word auth' are checked as part of the 'strong auth' computation already being used to protect the memory content. If a 'word auth' fails during power-up auth (as opposed to during runtime), this constitutes error detection, and therefore the integrated circuit attempts to correct the error that has been found in its memory content e.g. by performing all or any subset of operations 140-170 of FIG. 3.

80: if the memory is a code execution memory, a suitable Power-fail safe Code recovery update flow may be executed if error correction e.g. performing all or any subset of operations 140-170 of FIG. 3 results in resolving of corrected code. Once the code has been successfully corrected, the processor can resume running aka normal operation.

The method of FIG. 3 may include all or any subset of the following operations, suitably ordered e.g. as shown.

140: All one bit permutations (say: 128+16 permutations in the illustrated embodiment) of the bad word (word in which error was found e.g. because 'word auth' failed for this word, during power-up auth) are checked, searching for a match.

It is emphasized that any suitable proportion may exist between the data and auth portions; the 128 and 16 bit parameters are merely illustrative.

A dedicated HW or SW may quickly scan all permutations (e.g. on memory or as part of memory control and interface unit without needing to iteratively write-to/read-from memory e.g. flash).

According to certain embodiments, a dedicated buffer holds the data structure of the bad word, where the bad word may be manipulated bitwise. Dedicated firmware code, or a hardware state machine, then scans permutations of the data structure, flipping one bit (see e.g. FIG. 10, 'Flip One Bit' block), or more, at a time. For each permutation, the word auth is computed for the then-current, manipulated, bit-flipped data structure.

It is appreciated, generally, that scanning of permutations may be accomplished by firmware, or, alternatively, may be accomplished by dedicated hardware.

150: If a match is found, the erroneous data or content as corrected or rectified (e.g. the proposed correction of erroneous content) may be digested as part of the 'strong auth' computation. Depending on the auth algorithm and the number of corrected bits, it may be that more than one match may be found. In this case, all permutations of matching bit combinations, aka patterns, may be tried and the one that yields the correct 'strong auth' is taken. Correct typically means that the result of strong auth with (or applied to) the rectified code is equal to the pre-computed result of strong auth with (or applied to) the original contents of the memory.

For example, for one-bit errors the method may include flipping a first bit e.g. bit 0 and checking auth; then subsequent bits e.g. bit 1, 2 etc. until a match is found. For 2 bit errors, each pair of bits may be flipped and each possible pair of values for the two bits is typically considered separately.

160: otherwise, optionally, try to correct more than one error e.g. by searching again, this time over at least some double-bit permutations of the error. It is appreciated that if more than one error (involving more than one bit) can be corrected with high likelihood, but according to some embodiments errors involving plural bits are not corrected because computation is more complicated than for one bit, requiring ~$X^2/2$ (~$144^2/2$) checks.

170: If the error cannot be corrected, typically an alert is provided to the end-user e.g. via higher level software as shown in FIG. 1.

FIG. 4 is a method for carrying out error correction and verification when the memory is page-based nonvolatile memory. Typically, in such memory one can only erase whole pages (or the entire memory). Thus, when an error is found that needs to be corrected, page juggling is typically performed to enable the correction to be applied e.g. copying the page with the correction to some reserved page while applying the correction. More generally, it is appreciated that the present invention includes corrections which are made under memory usage restrictions.

The method of FIG. 4 may be performed at any suitable time e.g.

1—Immediately upon error detection (operation 220 below).
2—Upon the next IC boot (operation 230 below).

The method of FIG. 4 may include all or any subset of the following operations, suitably ordered e.g. as shown.

Operation 210: Identify the flash pages to be corrected. If there is more than one page, for each, keep (an indication of) the words (addresses+data) that needs to be corrected in volatile memory. Next, perform operation 220 to correct immediately, or operation 230, to correct after the next boot.

Operation 220: correct each page that needs to be corrected, e.g. by performing, for each page, all of operations 310-350 in FIG. 5. End.

Operation 230: During boot time, before flash code authentication is performed, the boot code checks if there is a page which is known to be e.g. marked as usable, and if so, the boot code completes all or any subset of operations 310-350 before continuing the boot. Otherwise, some higher level firmware may perform 'garbage collection', e.g. condensing memory contents to occupy the smallest possible memory space, thus freeing at least one page for the temporary purpose of error correction.

The method of FIG. 5 may include all or any subset of the following operations, suitably ordered e.g. as shown.

Operation 310: Write the flash page address and corrected data (code) in a reserved predefined flash page and verifies that it was written correctly.

Operation 320: Set a bit in the reserved page that indicates, e.g. to other firmware, that this page carries valid info, or is in use and should not be erased. The bit is also useful in case the system of the present invention is interrupted, e.g. by user power-off, and seeks to resume operation thereafter.

Operation 330: Erase original flash page (that in which error/s was/were found in operation 210 of FIG. 4)

Operation 340: Update original flash page with corrected data from the reserved flash page and verify that it was written correctly Operation 350: Erase the reserved page to enable future use thereof for correction of errors in other pages Variants re what triggers performance of the error detection/correction method of FIG. 2 onward may include:

I. On the fly: respond to word auth failures by a memory check right away: if a word auth mismatch is found while reading from the target memory, the process is gone through before whatever comes next in the execution sequence of the processor doing the execution.

For example, if code from the memory is being executed, and during code fetch word auth failure is identified, execution typically halts to allow, say, the whole memory space or array to be scanned for failures or errors. Thereafter, the halt is terminated, and whatever comes next in the execution sequence of the processor is executed, or execution may be restarted from the beginning of the code. In the case of data which is not code, there may be an indication of error during data read, in which case, again, the processor may halt and the memory scanning/correction/verification may be triggered.

II. Power-up: triggered by each event of the integrated circuit waking up from a less active state e.g. power up, or change of state from sleep to active, the strong auth is recomputed, compared to the pre-computed strong auth, and in case of a mismatch between the re-computed and pre-computed strong auth, the error correction mechanism is invoked as described above.

III. Periodic aka scrubbing: upon occasion, the strong auth is recomputed, compared to the pre-computed strong auth, and in case of a mismatch between the re-computed and pre-computed strong auth, the process of memory error correction as described herein may be invoked. This trigger may be implemented, say, using some programmable timer which gives an indication of a time at which the above is to be performed.

This typically has some penalty because regular operation of the integrated circuit is disturbed and interrupted, but greater protection is achieved.

IV. Initiated: triggered by an external event, e.g. if a device aka integrated circuit identifies e.g. using hardware or firmware hack detection which may be present in the IC, an attempt of hacking, or possibly some other functional error, the strong auth is recomputed, compared to the pre-computed strong auth, and in case of a mismatch between the re-computed and pre-computed strong auth, the process of memory error correction as described herein may be invoked.

V. Access-triggered: check the whole target memory each time the memory is accessed; practical e.g. for code which gets executed infrequently. This embodiment is suitable e.g. if the memory is accessed very rarely and real-time data integrity is imperative such that performance overhead is relatively unimportant.

It is appreciated that all or any subset of the above variants may be provided, in any given device.

A flow for operation of the integrated circuit of FIG. 1, which may be controlled or put into effect by processor 1 of FIG. 1, is shown in FIG. 6 and may include all or any subset of the following operations, suitably ordered e.g. as follows:

Operation 1001—Fill the memory zone with contents, e.g. code, which includes a multiplicity of words. For each word, compute the "word auth" while writing, and store the "word auth" e.g. adjacent to the word.

Operation 1002—Run "strong auth" over the memory contents and store the result somewhere in the memory (may be pre-computed e.g. by an entity preparing the memory image offline, which has the capability of executing strong auth) and provided to the IC in which the secured memory array 2 resides.

It is appreciated that not uncommonly, a memory image is prepared outside an IC and "injected" into the IC for programming together with authentication code attached to the contents.

Operation 1003—Use the memory as usual including performing memory reads. Each memory read includes:
  computation of a current aka recomputed "word auth",
  reading from memory, the pre-computed word-auth stored in Operation 1001, and comparing the two.

If recomputed "word auth" equals the pre-computed word-auth read from memory, continue because all is well. Otherwise (not equal), assume an error has been identified, thus enter error correction sequence.

A suitable error correction sequence flow, including testing possible error corrections, is shown in FIG. 7 and may include all or any subset of the following operations, suitably ordered e.g. as follows, and may also be controlled or put into effect by error correction functionality which may be software-implemented and may reside e.g. in processor 1 of FIG. 1:

Operation 1006—perform error correction on content to be corrected including the word and its associated word auth, combined e.g. concatenated thereby to provide a combined string of bits. Error correction includes: scan all bits, flip each bit (if aiming to correct' one-bit errors, and/or each pair of bits, if aiming to correct two-bit errors) in the combined string of bits and recheck the word auth. Do not compare to the word auth stored in memory because the error may be in the word auth, not in the word. Instead, flip a bit, recompute the word auth and compare recomputed word auth e.g. to the word auth that is available on hand. For example, a structure of X bits of data and Y bits of auth may be read from memory. Bits then are flipped in the combined structure. If the bit being flipped is within the X bits of data, re-compute the auth for the corrected X bits of data and compare that re-computed auth to Y bits of auth that were read from the memory.

If the bit being flipped is one of the Y bits of auth, re-compute the auth for the X bits of data read from memory and compare to the corrected Y bits of auth.

If a match is found (comparison finds equality between the compared word auth's), this indicates a "consistent" word and word auth, skip to Operation 1009. If no match is found, flip next bit (or pair thereof) and repeat re-computation and comparison. It is appreciated that here and elsewhere, the term "next" may be physically adjacent or may be a bit deemed sequential or next in sequence by virtue of an ordering between bits defined by any suitable heuristic.

Operation 1008—Reaching this point typically means no bit-flip (or pair thereof, for two-bit errors) yielded a workable correction thus error correction has failed on the word-level; thus flag uncorrectable memory contents, e.g. by alerting higher-level software as shown in FIG. 1 and/or halt system, and/or processor 1 may prompt (e.g. by generating a suitable output indication) for higher level recovery e.g. sending the device housing the integrated circuit to a laboratory for human technical support.

Operation 1009—Do "strong auth" including computing a digest e.g. HMAC for the whole memory zone, thereby to yield a strong-auth result. Typically, strong auth yields a digest/MAC/signature.

Operation 10010—Compare the strong auth result to the pre-computed pre-computed strong-auth result stored in memory in Operation 1002. If the results are equal, there is a strong-auth match; otherwise (unequal) there is a strong-auth mismatch.

Operation 10011—If there is a strong auth match—memory content is qualified after correction, continue using memory as usual e.g. go to Operation 1003 Operation 10012—else i.e. If there is a strong auth mismatch—perform mismatch process e.g. as in FIG. 8.

A suitable flow for the mismatch process in Operation 10012, is shown in FIG. 8 and may include all or any subset of the following operations, suitably ordered e.g. as follows, and may also be controlled or put into effect by the error correction functionality:

Operation 10012.5: scan the whole memory 2 in FIG. 1, by redoing Operation 1006, but correct all identified errors.

Operation 10013—redo strong auth by redoing Operations 1009—11.

Operation 10014—If strong auth now fails (i.e. mismatch) assume unable to correct, thus higher level of recovery may be needed; thus flag uncorrectable memory contents, e.g. by alerting higher-level software as shown in FIG. 1 and/or halt system, and/or processor 1 may prompt (e.g. by generating a suitable output indication) for higher level recovery such as sending the device housing the integrated circuit to a laboratory for human technical support.

The functionality for testing possible error corrections e.g. as per the method of FIG. 7, may comprise a separate state machine which may be implemented, say, in hardware or firmware. This functionality gets "auth services" from auth functionality, typically including verification of word auth after attempting corrections (e.g. operations 6 above), and/or verifying the whole memory using strong auth (e.g. operations 9-12 above). Hardware implementation of all or most of the above, would typically yield best performance e.g. because if the entire flow is in hardware, on-the-fly verification is performed by hardware while using the memory, translating into no performance penalty if there is no error.

If almost all implementation is in firmware, on-the-fly word auth may be omitted, instead making do with memory scanning periodically and/or on occasion to check for errors, and then performing correction and verification (e.g. operations 6-12 above) in case an error is found.

If all implementation is in firmware, an existing aka legacy IC may be employed. An existing IC typically has an existing aka legacy memory structure, which may then be rearranged or managed logically in software, to store the word auths computed in the error correction process described herein. In such cases, error detection and correction would typically not be carried out on-the-fly, but rather off-line, upon a certain trigger, as described above.

Any suitable implementation may be employed to ensure that the functionality for testing possible error corrections interfaces with or gets "auth services" from, the auth functionality, even in an existing or legacy IC in which the legacy auth is configured to compare memory contents to a certain standard (a digest computed right after the most recent authorized memory update, for example). The implementation typically ensures that the auth compares a proposed error to be tested, to that standard; this may be ensured e.g. as follows:

i—FW may read data word+word auth from the memory.
ii—FW may compute the auth for the data word, either itself or using some hardware dedicated for this purpose.
iii—FW may compare the results of the computation to the auth value read from memory, and see whether the data structure is consistent, or has an error.
iv—If the FW identifies an error, the FW may go through the bit flipping process described herein, computing the auth as in operation ii above.
v—Once error correction is done through the memory, the FW may digest the whole memory contents, either by itself, or using some hardware which accelerates or eases the execution of whatever MAC algorithm the designer of the system has chosen for this purpose.

An advantage of certain embodiments herein is error correction which engenders no extra overhead above the overhead for (strong and word, typically) auth which is needed anyway.

Another advantage of certain embodiments herein is that speculative correction of errors (testing various possible error corrections) as described herein sets no hard limit on the number of bits. In contrast, convention error correction implements some kind of error correction code. For a given data size of X bits, to correct a certain, pre-decided number of errors, the number of binary combinations, and the method selected, dictate the numbers of bits required for error correction code. Once implemented, only the pre-decided number of bit errors, and no larger, can be rectified. The practical complexity of correcting errors typically grows with the number of bits one attempts to fix. However, if desired, very strong auth may be used to verify any number of errors corrected, enabling any number of bit errors to be corrected, if reasonable for a given use-case.

Another advantage of certain embodiments herein is that utilization of authentication for verification yields error correction which truly is correct, at a high level of confidence. For example, if strong auth is used to verify proposed corrections, this typically means that once the result of the strong auth on the "rectified data" aka proposed correction, shows a match with (e.g. is equal to) the expected strong auth, this implies cryptographic-level confidence that the rectified data is truly correct.

Another advantage of certain embodiments herein is protection against malicious content change as opposed to prior art systems which implement ECC (error correction code). However, a malicious attack may replace both the data and the error correction code, in a mutually consistent manner, such that the error appears to have been rectified, whereas in fact the content or code is bad or malicious. In contrast, by virtue of using auth for error correction as described herein, an attacker becomes unable to maliciously replace the data and the auth code as above, because the method herein is cryptographically strong.

It is appreciated that use of on-the-fly authentication may be particularly advantageous since performance remains unimpaired (authentication takes place in parallel) and/or data that has been read can be used right away, without delay, unless it is found to contain error/s.

Any memory e.g. code execution memory or large data blobs which are persistent or not often changed and/or especially if access to the memory content is controlled e.g. memory content which changes only via a secured or controlled (firmware) update, can benefit from the flow of FIG. 2, especially if the memory is unprotected or external. Memory which can benefit from the flow of FIG. 2 includes but is not limited to EEPROM, hard-disc, NAND-flash, NOR-flash, SDRAM, SRAM.

It is appreciated that various solutions exist for controlled access to memory, other than secured (firmware) updates. In particular, various technologies are known which allow access to memory content to be tightly controlled, such as but not limited to memory whose content can only be executed aka execute-only memory, or memory whose content can only be read, and which can only be updated or written to via a dedicated gateway after obtaining certain access privilege or authenticating, or memory that can only be written to after changing access control settings which are alterable only when having a certain access privilege.

Re memory content not often changed: For example, some memory content may be known to change typically at a frequency which is low enough, to cause the overhead engendered by the system and method described herein, to be cost effective. For example, code may be known to change only once every few months, say due to software updates occurring periodically or occasionally. Or, certain data may be known to change only once every few days or weeks, or may be known to change on average at those intervals. In contrast, some data may be manipulated by software, hence may change each time a program is executed or run.

Many variations are possible.

For example, according to some embodiments, an error is rectified aka corrected as soon as it is encountered, and the memory is then immediately repaired; after which whatever processes were being run, continue running.

Alternatively or in addition, an overlay patch may be provided to enable the device to continue running, by deferring actual memory content repair until later. This may be advantageous because NVM handling, which may be lengthy rather than causing delays as the device attempts to get this done online, is instead taken off line and done later, such that the device is able to continue running. The cached in dedicated override patch (NV or volatile) may reside in any computer memory, typically on the same IC, which is accessible to whichever processor/s are using the target memory, so as to be pulled out in case of need for target memory recovery.

Another example of possible variations is that any suitable authentication may be used to test possible error corrections, including but not limited to strong and word level auth, separately or in any suitable combination. It is even possible to detect errors based on strong auth over the whole memory, albeit inefficient in many contexts, if the flow demands going through the strong auth to just identify that an error exists in the memory, and once the error has been identified to exist, each memory bit may be flipped and then strong auth may be used to verify bit flips (or pairs thereof). Yet, although strong auth is a heavy, i.e. long and resource consuming, operation, this may be a perfectly viable implementation for small memory zones, for which there may be no need to provide two levels of auth.

In many use cases, use of 2 levels (termed herein word and strong, and more generally differing in heaviness i.e. the former being less long and/or consuming less resources and the latter being longer and/or consuming more resources) is useful to ensure the process is efficient.

For large memory zones, having the word auth, which is quite common, typically results in a much more efficient process, because errors may be detected on a word basis aka on the word level, and basic verification of proposed aka speculative corrections may also occur at the word level, thus strong auth to qualify or verify the correction need not be run too often, relative to embodiments in which the word-level auth is omitted.

Examples

Example i: speculate a proposed correction, apply the proposed correction, then strong auth to verify the correction. If this fails, try again—speculate another correction, etc.

Example ii: speculate a proposed correction, check word auth, if fails—speculate another proposed correction and again use word auth to check; continue until obtaining successful word auth. Then, use strong auth to finally verify the correction. Workable also without word auth.

Another possible variation is that any suitable method may be used to actually make a verified proposed correction, on memory contents. For example, if the memory content is code, a power-fail safe code recovery update process may be used to correct the code to apply the verified proposed correction to the code which, e.g. by having failed authentication, was found to be erroneous.

Variations may be designed, depending on performance-area-runtime-reliability tradeoffs, such as but not limited to:

A. Larger 'on-the-fly code word' yields:
   Smaller flash area & fetch throughput overhead (for a given 'redundancy' width)
   Larger bit correction time (to scan all bits)
   Larger fetch latency (if waiting for check before execute, the method of US20140082721 may be used; this co-pending patent document (https://patents.google.com/patent/US20140082721A1/en?oq=13%2f965%2c256) whose disclosure is hereby incorporated by reference describes a computing device, comprising:
a. an input bridge, coupled to receive a sequence of data items for use by the device in execution of a program; and an output bridge;
b. a processing core, coupled to receive the data items from the input bridge and execute the program so as to cause the output bridge to output a signal in response to a given data item in the sequence; and
c. authentication logic, coupled to receive and authenticate the data items while the processing core executes the program, and to inhibit output of the signal by the output bridge until the given data item has been authenticated.

B. Larger 'on-the-fly redundancy word' yields the following, relative to a smaller choice:
   More secured, more reliable, faster correction
   Larger flash area & fetch throughput overhead C. Larger 'strong auth' size (in bits) yields the following, relative to a smaller choice:
   More secured i.e. greater confidence that the authenticated original or corrected content of the memory is correct.
   Larger flash area overhead (typically negligible)
   SHA256-512 HMAC seems like a good choice D. Smaller code segmentation (when dividing code into segments with 'strong auth' for each) yields the following, relative to a larger choice:
   Larger area overhead
   Faster correction time
   Boot/cycle runtime may be maintained if the HASH is accumulative, i.e., use one HASH for the whole code while keeping intermediate results to speed up the correction process.

One recommendation is dynamically determining tradeoff parameter/s e.g. choosing different (larger or smaller) 'on-the-fly redundancy words' and/or different (larger or smaller) 'strong auth' size and/or different (larger or smaller) segmentation (when dividing code into segments with 'strong auth' for each), per flash statistics and/or per wear level. e.g. as the target memory gets old, change the aforementioned tradeoff parameters towards faster and more robust correction than the speed and/or robustness of error correction used when the target memory was younger (e.g. due to slower operation of an older and/or more worn flash, relative to a younger and/or less worn flash).

According to some embodiments, on-the-fly 'word auth' with statistic correction is provided. Rather than performing brute-force aka dumb scanning of all single bit flip options (possible corrections) throughout whole target memory, instead, if error is detected in a given word, take a "short cut" (vs. the dumb embodiment) by:

trying to rectify just the given word, again by scanning or searching all one-bit flips of just that word, and if/when the payload word can be corrected to be consistent with the auth word, invoke the strong auth as the supreme verification of memory contents integrity.

Thus, embodiments of this invention include inter alia:
a. a method for combined authentication/error correction, including:
   invoking strong auth as verification of integrity of at least a portion of target memory contents, including scanning of at least some single bit flip options throughout at least some of target memory;
b. ("dumb" embodiment:) a method according to embodiment a wherein the scanning is performed for the entire target memory
c. (on-the-fly 'word auth' with statistical correction embodiment:) a method according to embodiment a wherein word auth is employed and wherein, if auth error is detected in a given word, the scanning is performed for just that given word rather than for the entire target memory, thereby to try to rectify just the given word, and
   if/when the payload word is brought to consistency with the auth word, invoke the strong auth as the supreme verification of memory contents integrity.

It is appreciated that in statistical correction, there is no guarantee of success in correcting the memory contents.

In FIG. 1, re "other processor functions", it is appreciated that the illustrated processor may have any main functionality other than the specific functionalities described herein, and may use any peripherals such as but not limited to all or any subset of: timers, comm channels, converters.

Figure 10:
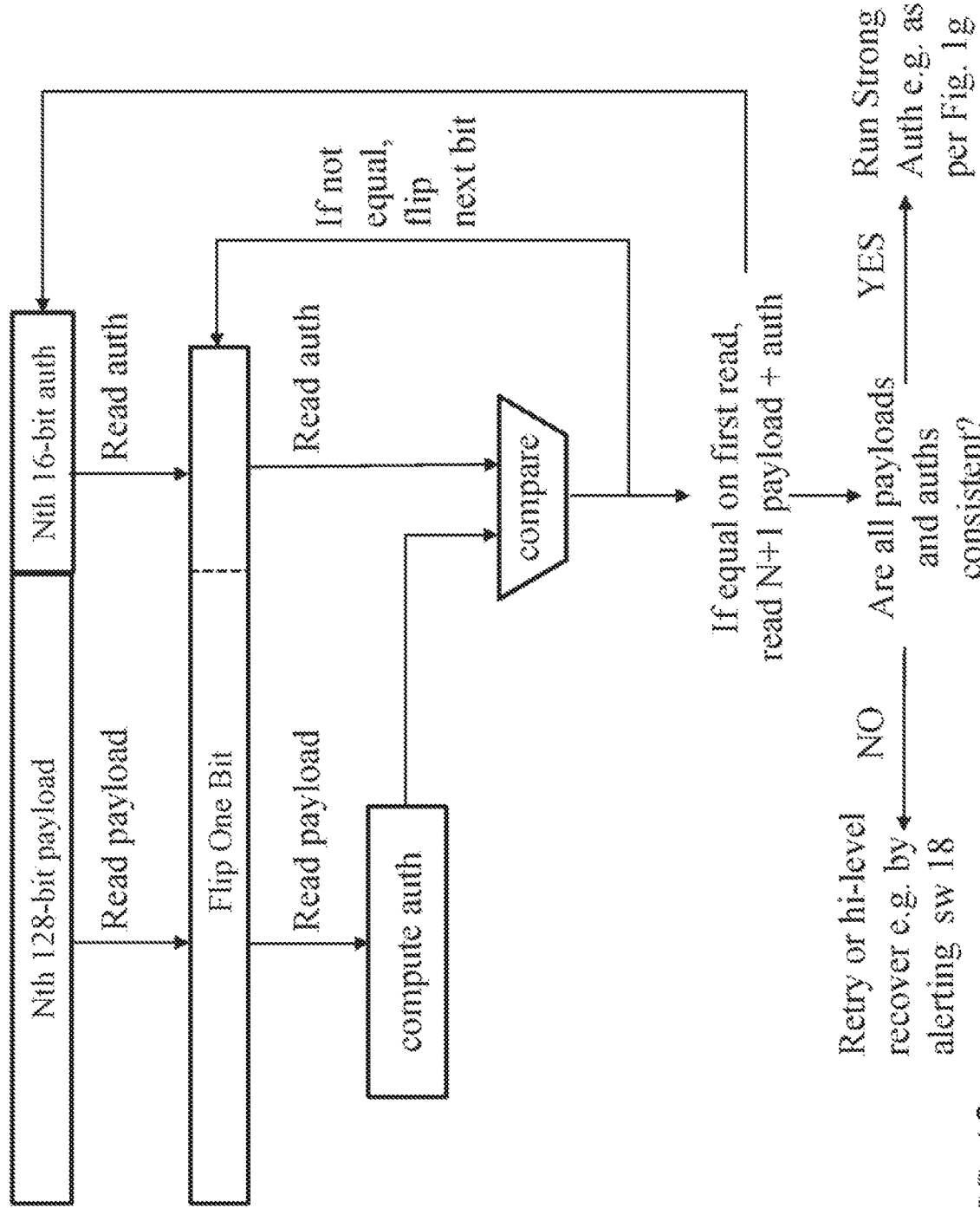
FIG. 10 is a diagram of Scanning and Error Correction functionality according to certain embodiments; it is appreciated that bit/s can be flipped sequentially, or in an order based on any suitable heuristic.
Figure 11:
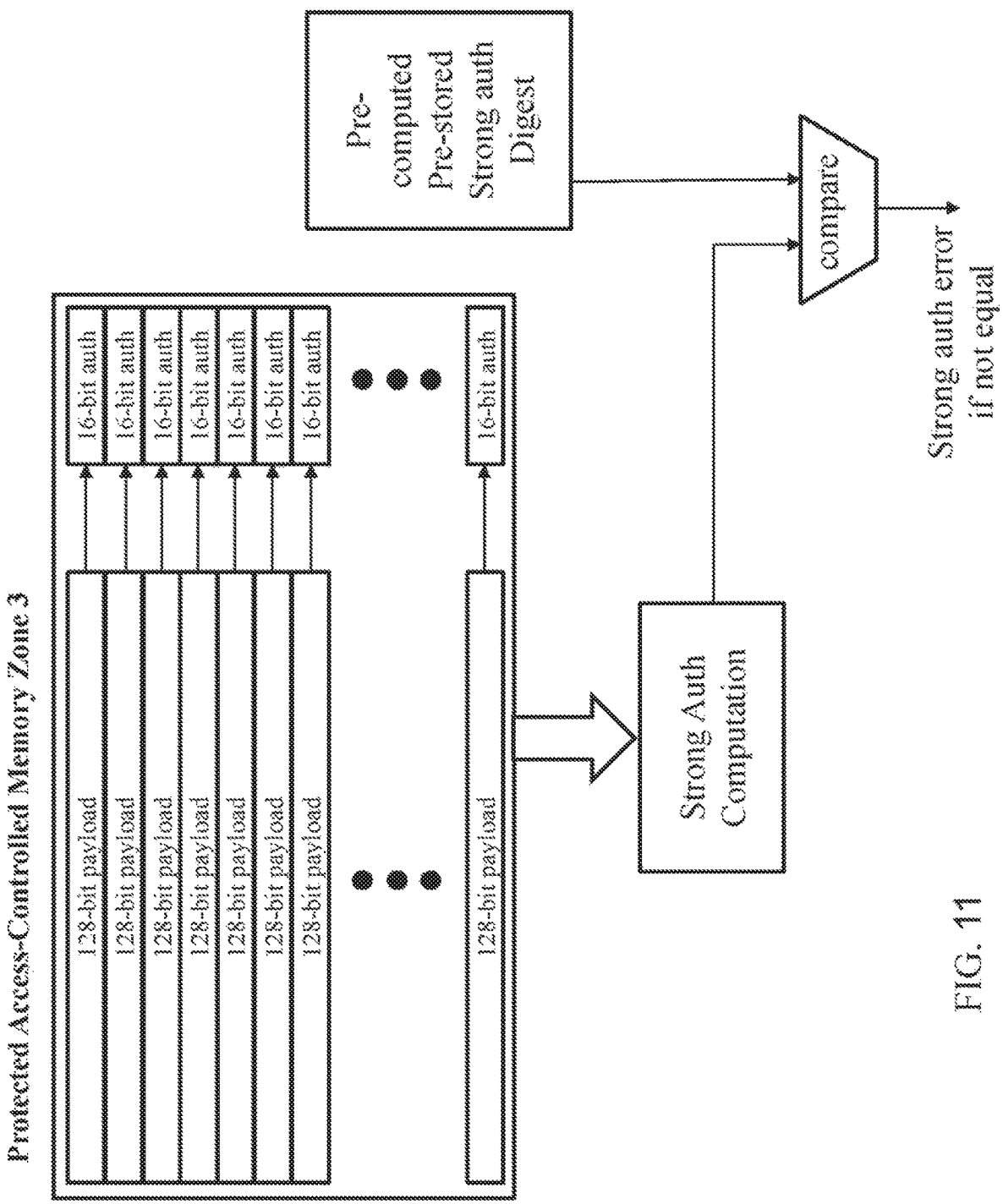
FIG. 11 is a diagram of memory zone 3 of FIG. 1, also showing strong auth comparison functionality.
Figure 12:
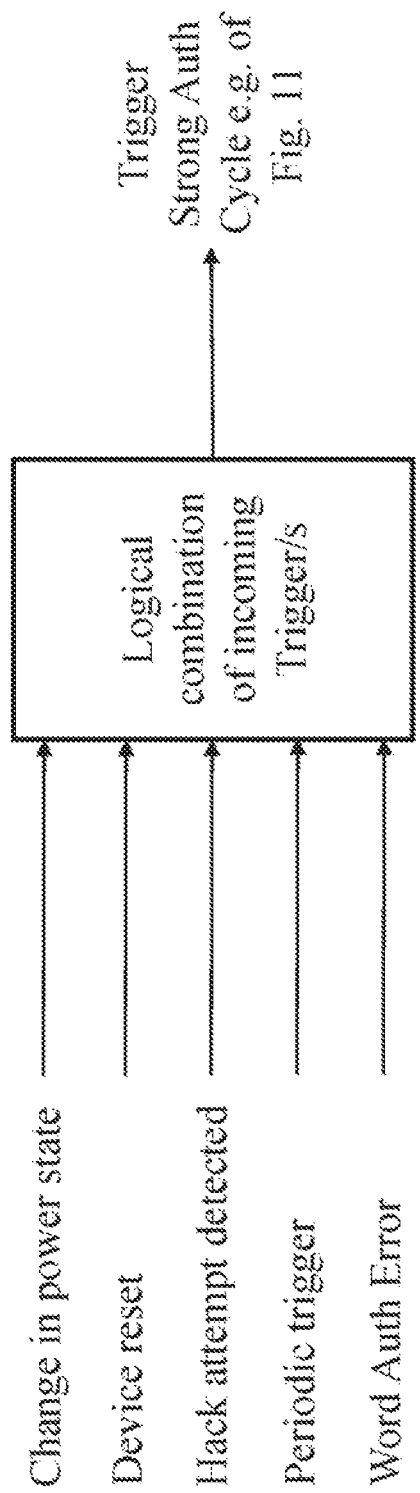
FIG. 12 is a diagram showing how a strong auth cycle may be triggered, according to certain embodiments.

Re scanning ("Flip one bit") in FIG. 10, this may e.g. be implemented in hardware and/or software, using any suitable permutation scanning process known to ordinarily skilled logic designers and software designers.

Figure 9:
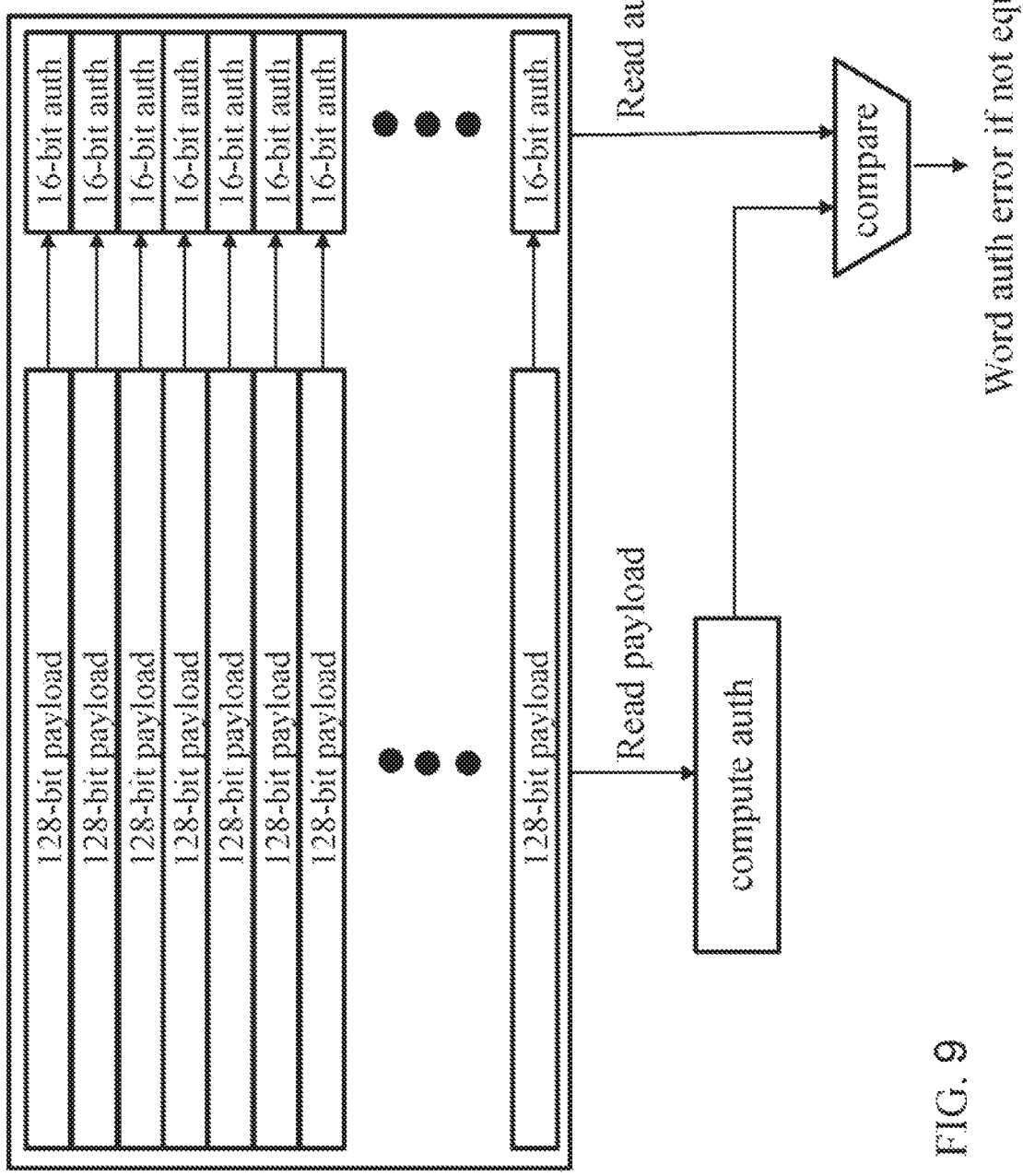
FIG. 9 is a diagram of memory zone 3 of FIG. 1, also showing word auth comparison functionality. Payload and auth sizes are indicated merely by way of example and may instead have any other value.

Re "compute auth" in FIGS. 9 and/or 10, this may comprise on-line word-auth computation. It is appreciated that word auth can have different levels of strength, wherein, typically, there is a trade-off between strength and performance. If strength is taken to an extreme, it is possible to assume that the word-auth may be the final verdict for the correction. In such cases, strong auth becomes optional. Thus either word auth, alone, may be used, or strong auth, alone, may be used, or both may be used, in which case word auth may be simplified (may be performed at a lower level of strength, thereby to yield better performance), relying on strong auth for the final verdict.

Generally, memory systems and specifically NVM systems utilize error correction flows. For example, as is the case with ECC, such systems may be able to detect memory errors yet unable to determine a priori (e.g. without trial-and-error experimentation) how to correct them. These flows may include the following operations a-c, shown in FIG. 13, which may be triggered by detection of an error:

a. The system generates an attempted or putative or candidate correction value b. The system attempts to replace suspected-erroneous data with the attempted or putative or candidate correction value e.g. by flipping the bit/s which, according to operation a, may be erroneous.

c. The system conducts certain checks (e.g. using auth, as described in the embodiments of FIGS. 1-12 herein) intended to verify or validate that the putative correction was successful, e.g. to determine whether or not the putative correction is successful.

The system and method of FIGS. 1-12 are an example of a system which operates in accordance with the trial-and-error process of FIG. 13.

Typically, in operation a of FIG. 13, the putative correction comprises a flip of a certain bit, and if operation c determines this flip was not successful, then the system returns to operation a and flips some other bit, and if all bits are flipped and none are deemed successful in operation c, then the system either "gives up" (and, perhaps, the NVM system is sent to a lab for repairs) or perhaps the entire process may be repeated for two-bit flips.

When this type of flow, termed herein a "trial-and-error" flow, is used, the cycles may be costly in time and power. The term "cycle n" here typically includes performing the above operations a, b, c, for a given bit-flip, and repeating operations a, b, c, for some other bit-flip, if cycle n fails, is termed cycle n+1, and so forth. Thus the maximum number of cycles performed each time an error is detected or suspected in a given word w, is the number of bits in w.

Typically a cycle begins with guessing, say, a one-bit (or two-bit) flip and ends with attempting to verify an attempted correction to determine whether the attempted correction was successful or not.

The embodiments of FIGS. 1-12 constitute one example of trial-and-error-based error correction.

It is appreciated that a memory bit holds electrical charge which causes the bit, when "read", to yield a certain voltage level. This voltage level is then thresholded to determine whether the voltage level should be interpreted as (for a binary bit) a logical '0' or a logical '1', or, for an n-level memory, whether the voltage level should be interpreted as, say, 00, 01, 10 or 11. for example, a binary bit may show a voltage level between 0V and 2V and perhaps if the voltage level is lower than 1V, the level of the memory bit is deemed to be logical 0, whereas if the voltage level as read is above 1V the level of the memory bit is deemed to be logical 1. 1V is thus referred to herein as the "threshold" for distinguishing a logical 0 from a logical 1. In a healthy memory, the memory and its controls all ensure that the charge kept in the cell or discharged therefrom is such that the read voltage level is as close as possible to the edges of 0V and 2V to avoid getting too close to the 1V threshold, to prevent ambiguity since physical "checks" are never absolutely accurate.

It is appreciated that in certain memories, such as but not limited to NVMs, data is available regarding each bit cell state's quality or strength or level of confidence that a given bit cell state derived from a given voltage read at a given time, is truly correct or distance of a given voltage read at a given time, from the threshold levels just above and/or just below that voltage level as read. Continuing the above example:

In the context of the same example where binary bit voltage may range between 0V and 2V, with the threshold level being 1V, a given bit which was supposed to be at logical 0, may in practice hold many different amounts of charge and consequently may be read out as many different voltage levels such as 0.1V, 0.2V, 0.373187V or 0.999999V, or anything in between. In all those cases the bit will be read as 0. However, in NVMs inter alia, it is possible to access data indicating which voltage level was actually read and/or how distant the actual voltage level is, from the voltage threshold. If the data indicates a reading of 0.1V for example, since this is very far from the threshold of 1V, the quality or strength or level of confidence of the logical-zero reading is deemed high. In contrast, if the data provided by the NVM indicates a voltage reading of 0.999999V, the bit is still deemed to be logical-zero, however the quality or strength or level of confidence of the logical-zero reading is deemed extremely low, and the "quality" or "strength" of a reading of 0.9V, or 0.8V is deemed quite low, far lower than the 0.1V reading, yet higher than the voltage reading of 0.999999V.

The optimization is typically based on a characteristic of, for example, conventional NVM, which supports detection of the quality or strength of bit cell states vs. threshold levels, typically predefined, which serve as cut-off points between adjacent bit cell states. More generally, various memories, such as but not limited to NVMs, may have built-in mechanisms e.g. "margin read" functionality, which provide an indication of where exactly a bit is, in the continuum between 0 and 1, or of how "strong" the bit is, or provide an indication of the confidence level in the bit's (0 or 1) value, rather than just outputting a 0 or a 1. Thus, the margin read output indicates, say, that a 0 that is being read is in fact a 0.2V, or 0.36V, whereas by default, when reading from memory without activating the margin read, the operation yields just a 0 or a 1, without any indication of the "quality" or "strength" of that 0 or 1.

Typically, to optimize the bit checking order, the method herein is operative to rank the bits, according to how distant each bit's voltage reading is, from its adjacent voltage thresholds (either the threshold just above the voltage reading, or the threshold just below). Typically, the distance value used for ranking is defined as the distance between the voltage value as read, and the threshold (either above or below the value that was read) which is closest to the value that was read. Thus typically, the distance value is the smaller from among:

i. the absolute value of the difference of the voltage reading and the voltage threshold just above the voltage reading; and ii. the absolute value of the difference of the voltage reading and the voltage threshold just below the voltage reading.

Then, the method prioritizes those bits whose voltage readings are least distant from the voltage thresholds adjacent to the voltage reading, over bits whose voltage readings are more distant from the voltage thresholds adjacent to the voltage reading. This is advantageous because a large distance between the voltage reading and the reading's adjacent thresholds is indicative of a "healthy" bit which is less likely to be erroneous, or less likely to have "eroded" or "evaporated". Conversely, a small distance between the voltage reading and the reading's adjacent thresholds is indicative of a relatively unhealthy bit which is more likely to be erroneous, or more likely to have "eroded" or "evaporated"; thus it is advantageous to prioritize this latter, "highly suspect" bit over the former, "less suspect" bits which enjoy the large (voltage reading, threshold) distance which is indicative of proper memory function.

Upon detection of a bit error, the correction cycle comprises a 'trial and error' process of flipping one (or perhaps 2 or even 3) bits at a time and verifying (or not) the result.

Threshold levels may be used to determine the order of bit-scan as an optimization of the time required to successfully carry out an error correction.

Typically, e.g. if a bit error is detected (e.g. if a mismatch is detected between computed and stored/pre-calculated HMAC or any other type of message auth code other than HMAC which is but one specific code) in a given word W, which has B bits, the method shown and described herein ranks or orders (at least some of) the B bits by making an a priori determination of which bits are most/least likely to succeed (in yielding a successful correction, if flipped), starting from the bit which if flipped is most likely to constitute a successful correction value, and ending with the bit which if flipped is least likely to constitute a successful correction value. Typically, the bits most likely to succeed are those bits which, given their low bit cell state quality/strength, are most likely to be erroneous, whereas the bits least likely to succeed are those bits which, given their bit cell state quality/strength, are least likely to be erroneous. Then, the "trial-and-error" flow above, typically including operations a-c above, is performed on each of the various bits in word W, in the above order, stopping as soon as a bit flip is found which yields success in operation c above. Thus, the number of "cycles" (the number of times the "trial-and-error" flow above is performed) is, statistically, reduced, because starting from the bits most likely to succeed and then stopping cycles once a successful bit has been found, tends to result in less cycles than if the bits are scanned in an order other than the above order e.g. in the physical order of the bits in the word.

The system, e.g. as exemplified in the embodiments of FIGS. 1-12 herein, may for example comprise all or any subset of:

an NVM or other memory system which provides "quality" or level of confidence data as described herein;

an HMAC signature per predefined line length, or any other kind of line signature a mechanism for cryptographically-strong signature/authentication for an entire chunk of data whose integrity it is desired to maintain.

It is appreciated that the strong overall auth for the entire chunk of data as optional and only line auth is provided, in certain embodiments.

Certain embodiments seek to provide threshold-level based priority correction.

Given an erroneous word having b bits, and given a "trial and error" method which involves flipping (some or all of) the B bits, resulting in B or less putative corrections, in an attempt to identify a verified bit flip which corrects the bit error, certain embodiments seek to provide threshold-level based prioritization of certain bits over others.

The bit checking order can be optimized by checking which bits are close to the threshold. For example, FIGS. 14*a*-14*b*, taken together, illustrate a method operative for ordering/ranking the bits in terms of most/least likely to succeed.

The method typically comprises all or any subset of the following operations, suitably ordered e.g. as follows:

2010. Read_R=Read flash word (including auth)

2020. Read_H=Read flash word with higher threshold value (like margin-read1) where "higher" means higher than a given, e.g. default or predetermined, threshold level.

It is appreciated that a margin read returns, for each bit, a logical 0 or a logical 1, determined by thresholding the voltage given the given threshold level, and does not return the voltage level itself. However, typically, instead of relying entirely on the default threshold to differentiate logical 0s from 1s, threshold may be varied, which allows a determination of how "strong" the 0s and is are. Reading with a higher threshold "biases" the output of the margin read towards 0. Continuing the previous example, consider various bits outputting various voltages between 2V and 1V hence all considered to be logical 1. As the threshold goes higher and higher, e.g. in equal steps, one or more of the bits' logical state or read value will, at some point, change from 1 to 0 when read (even as the physical state of the bit remains the same), indicating that these bit/s are outputting voltages which are just lower than the most recent elevated threshold (yet still higher than the penultimate elevated threshold). Thus reading the bits after each elevation of the threshold yields an indication of the voltage which in turns yields an indication of how strong the various logical 1s and 0s each are, by computing how distant each value (each most recent elevated threshold) is, from the default threshold/s above and/or below that elevated threshold.

It is appreciated that margin-read is a known test mode, including slow-speed reading which is used to check cell threshold voltage characteristics after PGM or ERS. Margin-read is available to end-users of NVM e.g. if the code or logic performing the error correction and/or bit flip prioritization methods shown and described herein is provided as firmware running inside the chip, then the code, being firmware, can use all NVM functionalities including Margin Read. Margin Read is more generally available for any user of the NVM at the hardware or firmware level.

2030. identify "weak" logical ones e.g. logical one bits that read differently (take a zero value rather than a one value) when, rather than being read with the standard threshold used for non-margin reading of bits, they are read using margin read with a threshold higher than the standard threshold. Typically define Check_bitsH by computing a xor of Read_R from operation 2010 and Read_H from operation 2020. Note that if a certain bit, say bit 4, in Check_bitsH, is 1 this suggests presence of a 'weak 1' in the original word, at bit 4.

2040. Iterate through bit indices (or iterate through the bits of) "Check_bitsH" one by one; for each bit index (or each bit), determine whether or not the word matches the auth.

2050. If a match is found—this typically indicates success e.g. indicates that a good correction candidate has been found. At this point, typically, the method attempts to verify or validate the "good" candidate. For example, word auth is performed, and if the word auth is successful the strong auth is also performed, to fully validate the correction candidate.

Thus, end flow, since if for bit-index 2 (say) the method finds that word matches auth—there is then no need to check further, e.g. to check bit-indices 3, 4, . . . .

Otherwise e.g. if no match is found,

2060. Read_L=Read flash word with lower threshold value (like margin-read0).

2070. identify "weak" logical zeroes e.g. logical zero bits that read differently (take a one value rather than a zero value) when, rather than being read with the standard threshold used for non-margin reading of bits, they are read using margin read with a threshold lower than the standard threshold. Typically define Check_bitsL by computing a xor of Read_R from operation 10 and Read_L from operation 2060

Note that if a certain bit, say bit 7, in Check_bitsL, is 1 this typically suggests presence of a 'weak 0' in the original word, at bit 7.

2080. Iterate through bit indices (or iterate through the bits of) "Check_bitsL" one by one; for each bit index (or each bit), determine whether or not the word matches the auth.

2090. If found a match—success—end flow.

20100. identify (e.g. by NORing the "weak" logical zeroes and ones already identified) the bits which appear to be strong (since they were not captured by either the higher read margin or by the lower read margin). Typically, Check_rest={BitwiseNOT(Check_bitsL BitwiseOR with Check_bitsH)} e.g.

20100a. Compute BitwiseOR, of Check_bitsL from operation 70, with Check_bitsH from operation 30

20100b. Define Check_rest by computing a BitwiseNOT of the BitwiseOR computed in operation 100a, with Check_bitsH from operation 30.

having identified (e.g. prioritized) error prone 1s and 0s (bits whose values are likely to be bad), "the rest" i.e. the bits deemed strong are checked, typically only if no error is found in any of the error prone 1s and 0s) in a suitable e.g. arbitrary order. This is because if none of the bits which are a priori most suspect are found to be the bit which can be successfully corrected, the method typically also "scans" (some or all of) the other bits to determine whether the bit which can be successfully corrected happens to be one of the strong bits. Since bits of certain state which are estimated as more likely to have the bad bit, do not always indeed have the bad bit (some or all of) the rest sometimes are scanned, when the method is not successful with the bits regarded as higher priority (e.g. the weak ones and/or weak zeroes).

20110. Iterate through bit indices (or iterate through the bits of) "Check_bitsL" one by one; for each bit index (or each bit), determine whether or not the word matches the auth.

20120. If found a match (e.g. if, in operation 110, the word matches the auth)—success.

20130. Else (e.g. if, in operation 110, the word does not match the auth)—fail, in which case typically, the method go to a higher "instance" for recovery of the bit error (e.g. outputs an error signal indicating the need for a laboratory intervention), because no more bits are left to be checked as correction candidates hence the whole correction process has failed.

20140: End flow.

It is appreciated that operations 2060-2090 are respectively similar to operations 2020-2050, except that the latter are identifying bits likely to be erroneous are among those bits deemed to be logical 0 bits, rather than (as in operations 2020-2050) from among bits deemed to be logical 1 bits. It is appreciated that in this particular embodiment, the method first seeks logical is that are likely to be erroneous because the step-wise elevation of the threshold divulges that their voltage/s as read is/are close to the default threshold. Subsequently, the method typically does the same for the 0s. However, alternatively, the method might start with the logical 0s and only then if at all, may check the logical 1s. Typically, if the memory in use is known to be more sensitive in either direction (e.g. is are more likely to be erroneous than 0s are), then the method may start with the 1s or more generally with the logical value that is known to be more likely to "erode". Thus, operations 2020-2050 only may be provided, or operations 2060-2090 only may be provided, or both may be provided and operations 2060-2090 may precede operations 2020-2050.

Regarding use of thresholds e.g. in operations 2020, 2060 above, which are lower or higher than the standard threshold used for standard reading (not in margin-read mode), it is appreciated that any suitable lower or higher threshold may be used such as a value that is 10% or 50% or 90% lower, or 10% or 50% or 90% higher, than the standard threshold. Design considerations include that a lower/higher threshold that is very close to the default or standard threshold used when not in margin-read mode, yields less false alarms but also yields more missed positives (more weak bits are missed).

In contrast, a threshold farther from the default yields a more sensitive margin read which is more likely to catch weak bits but also more likely to generate false alarms (to warn about bits which are not particularly weak). Thus the designer selects the lower and higher thresholds as s/he wishes, depending on the perceived trade-off between the benefits of sensitive detection of weak bits, vis a vis the cost of false alarms, e.g. based on the characteristics of the memory and other limitations.

According to certain embodiments, the number x of successful corrections which originated from weak 1s may be counted, and the number y of successful corrections which originated from weak 0s may also be counted. Then, the method may, if X>Y, prioritize weak 1s over weak 0s and/or the method may, if Y>X, prioritize weak zeros over weak ones.

Bit error prevention e.g. as in the method of FIG. 15 aka method 2, may be performed on occasion e.g. periodically, e.g. for preventative memory maintenance.

It is appreciated that error correction may be performed, for example, atop a system which includes and is triggered by bit error detection functionality. Alternatively however, error prevention may be performed in a system which, perhaps, lacks error detection functionality entirely but, perhaps, does have margin read functionality.

Method 2 is operative to identify bits likely to fail soon, e.g. in order to provide such bits with preventative treatment.

The method typically comprises all or any subset of the following operations, suitably ordered e.g. as follows;

20210. read a data region

20212: Perform a margin0 read aka margin-read0 of the data region.

20214: Perform a margin1 read aka margin-read1, of the data region.

Generally, a margin read test (margin1 or margin0 reads back the relative strength of a programmed (logical 1 or logical 0) bit e.g. by gradually bringing the threshold closer to logical 1 (or logical 0), increasing (or decreasing) the threshold. The point in the process at which the bit flips from 1 to 0 (or vice versa) indicates whether the bit is strongly or weakly programmed to logical 1 (or logical 0) e.g. as described elsewhere herein.

20220: If the 3 read values generated in operations 20210, 20212, 20214 are not all identical, perform METHOD 3 on the results of the above checks.

20230: Else, i.e. if the 3 read values generated in operation 20210 are all identical, wait for next integrity check event e.g. next strong auth and return to START operation 20210.

It is appreciated that a system designer may electively perform an "integrity check" e.g. strong auth, periodically or on occasion, to reconfirm the integrity of memory contents.

Here and elsewhere, it is appreciated that certain embodiments do not perform both margin1 and margin0 reads, and instead perform just one of the two e.g. due to design or other NVM maker limitations, or due to a time limitation of an implementer of the embodiments herein.

If the embodiment runs just one side (either 0 or 1, but not both), this is done and bits are prioritized accordingly. If there is a choice re which of the 2 sides to run, typically, the side that is more sensitive to erosion, e.g. by the maker of the NVM, may be run where sensitivity to erosion refers to likelihood of weakening or becoming erroneous. Since 0s and is typically differ in how, electrically, they are kept. e.g. one of them may represent the presence of electrical charge while the other represents the absence of charge, one may be more sensitive than the other to erosion hence to becoming erroneous. However, if both sides (both 0 and 1) are available and workable, the system typically runs both, and final prioritization is determined based on any suitable combination of the results of the two sides. For example, prioritization may be performed separately for each side, yielding ranking of the bits as 1, 2, 3, . . . depending on the distance of the actual voltage reading from the voltage threshold closest to that reading. Then, add up each bit's ranking from the margin1 read and the same bit's ranking from the margin0 read, thereby to yield a "combined ranking" for each bit. Then, prioritize the bits in order of the combined ranking.

It is appreciated that ranking need not be based on the distance from the threshold. Alternatively, all 1s may be ranked r_1 and all 0s as r_0, e.g. such that all 0s come after all 1s), or vice versa, such that all ones come after all zeros, e.g. based on knowledge or an empirical result indicating or suggesting that one's are more or less likely than zeros, to be erroneous.

The method of FIG. 16 typically comprises all or any subset of the following operations, suitably ordered e.g. as follows;

20310. if an error check mechanism exists (such as but not limited to signature/parity/redundancy), use the error check mechanism to check for errors of regular read (as opposed to margin-read) of the data region. Output of operation 310 is either ok, or not-ok 20320: If output of operation 20310 is ok, or if no error check mechanism exists, do nothing or make bits "stronger" e.g. by refreshing the data (e.g. by rewriting in the same memory location L, e.g. by copying first to another memory location (other than L) then back to the first memory location L, typically depending on mismatch and/or memory type 20330: Else, i.e. output of operation 20310 is not-ok, perform trial-and-error correction, bit by bit, prioritizing the mismatch read bits (bits whose values changed when the read threshold was increased or decreased hence are more likely than other bits to be erroneous) first, e.g. including flipping bits one at a time (in order of priority and rechecking error until a match is found.

It is appreciated that the methods illustrated and described herein may be applied, mutatis mutandis, also to multi-level cells which typically represent more than 2 values respectively separated by more than one threshold (as opposed to cells storing only either 0 or 1 in which errors can be corrected only by flipping a zero to a 1 or vice versa). For multi-level cells, typically, bits are compared and ranked, e.g. as described above, where the ranking criterion is or includes distance between the actual level and a (nearest) threshold where the nearest threshold typically comprises the threshold T characterized in that the difference in voltage between threshold T and the actual voltage of the cell is the smallest among all thresholds. This is advantageous because T is the threshold most likely to be crossed in the event of erosion of the corresponding bit.

For multi-level cells, ranking may be performed, e.g. as described above, based, say, on the distance between the actual level and the threshold between any two adjacent levels associated with two adjacent states or values of a given cell. Thus the method may, for multi-level cells, still check whether the voltage level kept by the cell is close to a "decision" threshold. However, attempted corrections would not be just bit flips as may be the case for binary (0/1) cells and instead would include attempting value shifts from one value e.g. the value currently represented but suspected of being erroneous, to an adjacent value which may result in a correction of the error. For example, if a cell represents 4 values, namely 0 or 1 or 2 or 3, or 8 values namely 0-7, then if a 2 is read.

If the 2 is predeterminedly close to the threshold between the 2 and 1 values (e.g. is closer to the threshold between 1 and 2, than to the threshold between 2 and 3), the method may attempt to correct the 2 value to 1; otherwise, e.g. if the 2 is close to the threshold between 2 and 3, the method may attempt to correct the 2 to 3.

Typically, during error correction as described herein, the memory is "unavailable". e.g. because, if the system in which the IC resides is devoting the memory to, or keeping the memory occupied for, error detection and correction, the "functional" application running in the IC is left unable to go on running due to that functional application's being prevented from using the memory.

Thus, typically, when a memory error has been detected, and/or when it is time for a periodic or logically initiated or otherwise triggered memory check, the functional application is stopped by suitable logic, the memory correction function is commanded to take over, and once memory correction has been completed (and if memory error correction is successful), control is handed back over to the functional application.

It is appreciated that in certain use cases, once an error is detected, there may be no point in letting the system continue using the memory because it may harm the system. Typically, it is up to the designer of the system to design suitable logic which determines, typically depending on where an error is found, whether to halt everything until the error is rectified, or continue operating and wait, or defer until a suitable future occasion, to rectify, or even not to bother to rectify at all.

For example, the logic may halt everything if a bit has erroneously flipped in critical microprocessor opcode. This prevents the critical application from, say, getting lost in execution or otherwise producing unexpected harmful results or causing possibly disastrous malfunction. The logic may also halt everything if a bit flips in critical data, e.g. crypto keys.

In contrast, the logic may continue operating if the erroneous bit flipped in, say, a non-critical audio file or video file, which will at worst result in momentary noise or an incorrect pixel in a video which is merely, say for entertainment, hence as low criticality. Probably, in such a case, one could consider deferring the correction until a later point in time, or maybe even skipping it at all.

It is appreciated that any conventional physical data manipulation may be employed to implement "trial and error" bit flips described herein. For example, once an erroneous word has been identified somewhere in an NVM, the physical data manipulation may include all or any subset of the following operations, suitably ordered e.g. as follows:
i. copying
the smallest erasable NVM block comprising this word to SRAM,
ii. setting a bit counter i=0.
iii. Reading the subject erroneous word into variable A.
iv. copying A to variable B. Do—B={B XOR 2^i}. This flips bit i in B.
v. Writing B, which is now the word with bit i flipped, back to the location of the word in the SRAM copy of the block.
vi. Running an integrity check on the block in SRAM.
vii.—If the integrity check of operation vi is successful, indicating that the error has been successfully corrected—erasing the associated NVM block and copying the successfully corrected block from SRAM back to the NVM.
viii.—else, e.g. if the integrity check fails on bit i, indicating that flipping bit I does not successfully correct the error, do not copy back. Instead, increment i by 1, and as long as i<16 (assuming there are 16 bits in the word) return to operation iv.
ix. if I=16, generate an output indicating correction attempts have failed.

It is appreciated that, if it is desired, to make the bit flips "in place", and if the memory is a NVM, the subject chunk may be placed in volatile memory e.g. SRAM, followed by operations of flipping the bit, erasing the subject chunk in NVM and writing the data with the flipped bit back, from the volatile memory into the NVM.

Thus the scope of this invention includes various physical implementations including but not limited to such in which a functional system is unable to use the memory while error correction takes place. Thus the scope of this invention includes various physical implementations including but not limited to such in which a subject chunk is copied to SRAM and all bit manipulations and correction attempts are done in the SRAM, and then the corrected chunk is copied back to the NVM thereby leaving the NVM "available" for use.

It is appreciated that the methods herein can be applied to legacy NVMs, even those which have already been deployed, by implementing the entire method 1 and/or 2 and/or 3 in firmware, and/or by adding logic on the interface to the NVM. Optionally, hardware may be added to the NVM to accelerate (relative to firmware-only implementation) all or any subset of the operations in the methods shown and described herein by implementing these operations in hardware.

One advantage of certain embodiments is acceleration of run-time checks such as word auth.

It is appreciated that there may be use cases in which it is desirable to try out various possible error corrections without necessarily first providing or receiving or generating an indication that an error does exist in certain bit/s.

It is appreciated that prioritizing bits for error correction according to each bit's response to margin read is independent of the specific error correction that happens to be used. For example, the embodiment of FIGS. 1-12 may be used, but this is not intended to be limiting since the prioritization shown and described herein, by prioritizing bits more likely to be erroneous over bits less likely to be erroneous, statistically reduces overall correction cycle time for any trial-and-error correction method, of which the methods of FIG. 1-12 are but one example.

It is appreciated that bit flipping herein may refer to actual flipping of bits, on a trial and error basis, in the actual memory whose integrity is being protected, where the bit which succeeds in correcting an error remains flipped and all other bit flips, which do not succeed in correcting any error, are reversed by flipping the bit again. Alternatively, flipping may refer to flipping bits in a complete or partial copy of the memory's contents, whose copy may reside elsewhere, rather than in the actual memory whose integrity is being protected and only once a bit is found, which succeeds in correcting an error, that bit is flipped in the actual memory. Other bits, which were flipped in the copy in the course of a trial and error process, but did not yield a correction of any error, are not flipped in the actual i.e. original memory, and may not even be flipped back in the copy.

Firmware, if used to implement certain embodiments herein, may be held in non-volatile memory, e.g. Flash or ROM.

Alternatively, certain embodiments described herein may be implemented partly or exclusively (i.e. without firmware) in hardware in which case some or all of the variables, parameters, sequential operations and computations described herein may be in hardware.

It is appreciated that terminology such as "mandatory", "required", "need" and "must" refer to implementation choices made within the context of a particular implementation or application described herewithin for clarity and are not intended to be limiting, since, in an alternative implementation, the same elements might be defined as not mandatory and not required, or might even be eliminated altogether.

Features of the present invention, including operations, which are described in the context of separate embodiments, may also be provided in combination in a single embodiment. For example, a system embodiment is intended to include a corresponding process embodiment and vice versa. Features may also be combined with features known in the art and particularly, although not limited to those described in the Background section or in publications mentioned therein. Conversely, features of the invention, including operations, described for brevity in the context of a single embodiment or in a certain order may be provided separately or in any suitable sub-combination, including with features known in the art (particularly although not limited to those described in the Background section or in publications mentioned therein) or in a different order. "e.g." is used to denote an example not intended to be limiting. Each method may comprise some or all of the operations illustrated or described, suitably ordered e.g. as illustrated or described herein.

The invention claimed is:

1. A method for prioritizing trial-and-error attempted corrections of at least one bit, in an integrated circuit including memory, in which logical bit levels are determined by thresholding voltage values using at least one threshold, the method comprising:

ranking plural bits such that a first bit from among said plural bits is ranked before a second bit, from among said plural bits, which is less likely than said first bit to be erroneous and sequentially attempting to correct said plural bits in order of said ranking, thereby to define plural attempted corrections, including attempting to correct said first bit which is more likely than said second bit to be erroneous, before attempting to correct said second bit, which is less likely to be erroneous, wherein the memory is aboard a chip and wherein code performing the method is provided as firmware running inside the chip, and wherein the memory of the integrated circuit has Margin Read functionality and wherein the firmware uses the Margin Read functionality to determine the distance of the voltage reading of each bit to be corrected e.g. flipped, from the respective voltage threshold.

2. The method according to claim 1 wherein the memory includes single-level cells aka binary (0/1) cells, and wherein said sequentially attempting comprises sequentially flipping said plural bits, thereby to define plural attempted bit-flips, in order of said ranking, including flipping said first bit which is more likely than said second bit to be erroneous, before said second bit, which is less likely to be erroneous, is flipped.

3. The method according to claim 2 wherein said plural bit-flips continue until one of the following occurs:
  all bits have been flipped;
  an attempted bit-flip from among said plural bit-flips is determined to have been successful in correcting the error.

4. The method according to claim 2 wherein said ranking comprises assigning higher correction priority to ones than to zeros, if successful 1-to-0 corrections are more numerous than 0-to-1 corrections.

5. The method according to claim 2 wherein said ranking comprises assigning higher correction priority to zeros than to ones, if successful 1-to-0 corrections are less numerous than 0-to-1 corrections.

6. The method according to claim 2 wherein said ranking comprises determining a distance of a voltage reading of each of plural bits to be flipped, from a respective voltage threshold used to convert said voltage reading into a logical bit value.

7. The method according to claim 6 wherein said sequentially flipping includes attempting a first bit-flip from among said plural attempted bit-flips before a second bit-flip, when said distance, for said first bit-flip, is smaller than said distance, for said second bit-flip.

8. The method according to claim 1 and also comprising detection of a bit error in said at least one bit and wherein said detection triggers said ranking and said sequential attempting.

9. The method according to claim 1 wherein said memory comprises an NVM.

10. The method according to claim 1 wherein said plural attempted corrections continue until one of the following occurs:
  attempts have been made to correct all bits;
  an attempted correction from among said plural attempted corrections is determined to have been successful in correcting the error.

11. The method according to claim 1 further comprising providing legacy authentication functionality and wherein said sequentially attempting to correct e.g. sequential flipping continues until one of the following occurs:
  attempts have been made to correct all bits e.g. all bits have been flipped;
  the legacy authentication functionality determines that an attempted correction e.g. bit-flip from among said plural attempted corrections e.g. bit-flips is successful in correcting the error.

12. The method according to claim 1 wherein said ranking comprises determining a distance of a voltage reading of each of plural bits to be corrected, from a respective voltage threshold used to convert said voltage reading into a logical bit value.

13. The method according to claim 12 wherein said respective voltage threshold is closest to said voltage reading, from among at least one voltage threshold/s used as cut-off points to convert said voltage reading into a logical bit value.

14. The method according to claim 12 wherein said sequentially attempting to correct includes attempting a first attempted correction from among said plural attempted corrections before a second attempted correction, when said distance, for said first attempted, is smaller than said distance, for said second attempted correction.

15. A system for prioritizing trial-and-error attempted corrections of at least one bit, in an integrated circuit including memory, in which logical bit levels are determined by thresholding voltage values using at least one threshold, the system comprising:
  circuitry configured for ranking plural bits such that a first bit from among said plural bits is ranked before a second bit, from among said plural bits, which is less likely than said first bit to be erroneous and
  a controller configured for sequentially attempting to correct said plural bits in order of said ranking, thereby to define plural attempted corrections, including attempting to correct said first bit which is more likely than said second bit to be erroneous, before attempting to correct said second bit, which is less likely to be erroneous,
  wherein the memory is aboard a chip and wherein code performing the method is provided as firmware running inside the chip, and
  wherein the memory of the integrated circuit has Margin Read functionality and wherein the firmware uses the Margin Read functionality to determine the distance of the voltage reading of each bit to be corrected e.g. flipped, from the respective voltage threshold.

* * * * *